United States Patent
Terada et al.

[11] Patent Number: 6,163,459
[45] Date of Patent: Dec. 19, 2000

[54] SEMICONDUCTOR MOUNTING SYSTEM AND SEMICONDUCTOR CHIP

[75] Inventors: Yutaka Terada; Hironori Akamatsu, both of Hirakata, Japan

[73] Assignee: Matsushita Electric Industrial Co., Ltd., Osaka, Japan

[21] Appl. No.: 09/122,566

[22] Filed: Jul. 24, 1998

[30] Foreign Application Priority Data

Jul. 25, 1997 [JP] Japan ................................. 9-200637

[51] Int. Cl.$^7$ .................................................. H05K 1/14
[52] U.S. Cl. ..................... 361/736; 361/744; 361/686; 257/686; 257/777; 174/255; 174/260
[58] Field of Search .................................... 361/736, 744, 361/760, 820, 684, 686; 257/686, 777, 696, 695; 174/255, 260, 52.4

[56] References Cited

U.S. PATENT DOCUMENTS

| | | | |
|---|---|---|---|
| 5,016,138 | 5/1991 | Woodman | 361/688 |
| 5,327,327 | 7/1994 | Frew et al. | 361/784 |
| 5,334,875 | 8/1994 | Sugano et al. | 257/686 |
| 5,343,075 | 8/1994 | Nishino | 257/686 |
| 5,408,123 | 4/1995 | Murai | 257/531 |
| 5,420,751 | 5/1995 | Burns | 361/707 |
| 5,432,823 | 7/1995 | Gasbarro et al. | 375/356 |
| 5,514,907 | 5/1996 | Mashayedi | 257/723 |
| 5,602,420 | 2/1997 | Ogata et al. | 257/686 |
| 5,656,856 | 8/1997 | Kweon | 257/686 |
| 5,671,125 | 9/1997 | Russell et al. | 361/760 |
| 5,754,405 | 5/1998 | Derouiche | 361/744 |

FOREIGN PATENT DOCUMENTS

| | | |
|---|---|---|
| 63-164256 | 7/1988 | Japan . |
| 01144664 | 6/1989 | Japan . |

OTHER PUBLICATIONS

Partial Translation of Office Action issued in Japanese Patent Application No. 10–210001; Office Action received by Japanese Associate on Feb. 25, 1999.

*Primary Examiner*—Jeffrey Gaffin
*Assistant Examiner*—David Foster
*Attorney, Agent, or Firm*—Renner, Otto, Boisselle & Sklar LLP

[57] ABSTRACT

A semiconductor mounting system of the present invention includes a first semiconductor chip in which a first semiconductor integrated circuit is packaged and a second semiconductor chip in which a second semiconductor integrated circuit is packaged. The first semiconductor chip includes a plurality of first pins provided on a first surface and a plurality of second pins provided on a second surface. The second semiconductor chip includes a plurality of third pins provided on a third surface and a plurality of fourth pins provided on a fourth surface. The semiconductor mounting system further includes: a plurality of first lines for electrically connecting the first pins with the third pins; and a plurality of second lines for electrically connecting the second pins with the fourth pins. A length of the first lines is substantially equal to a length of the second lines.

14 Claims, 20 Drawing Sheets

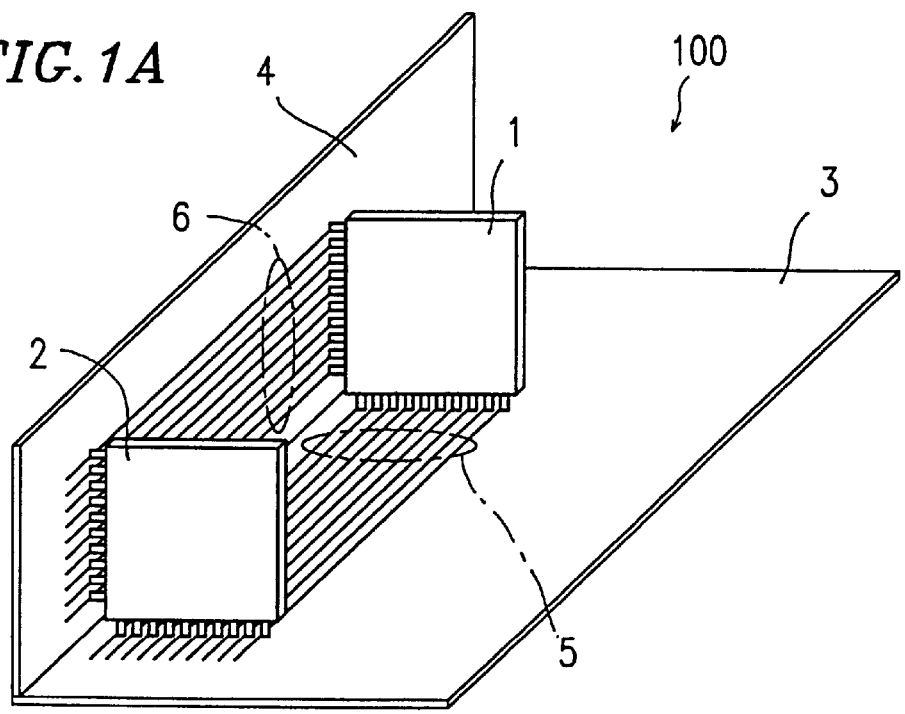
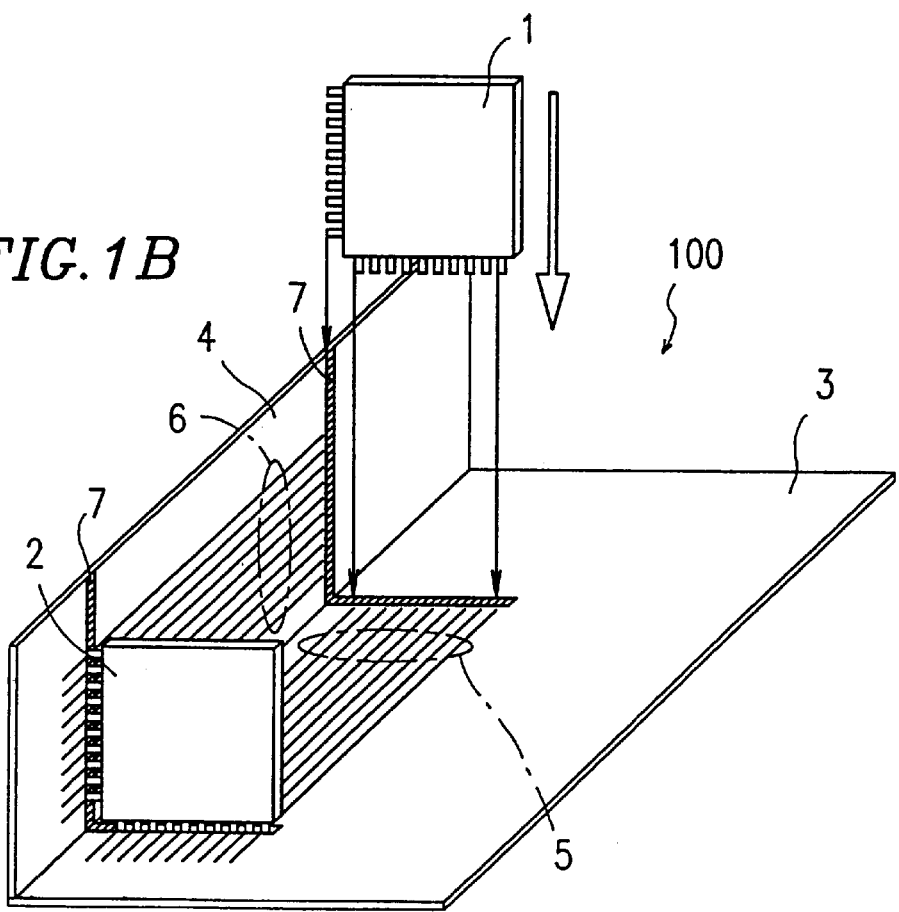

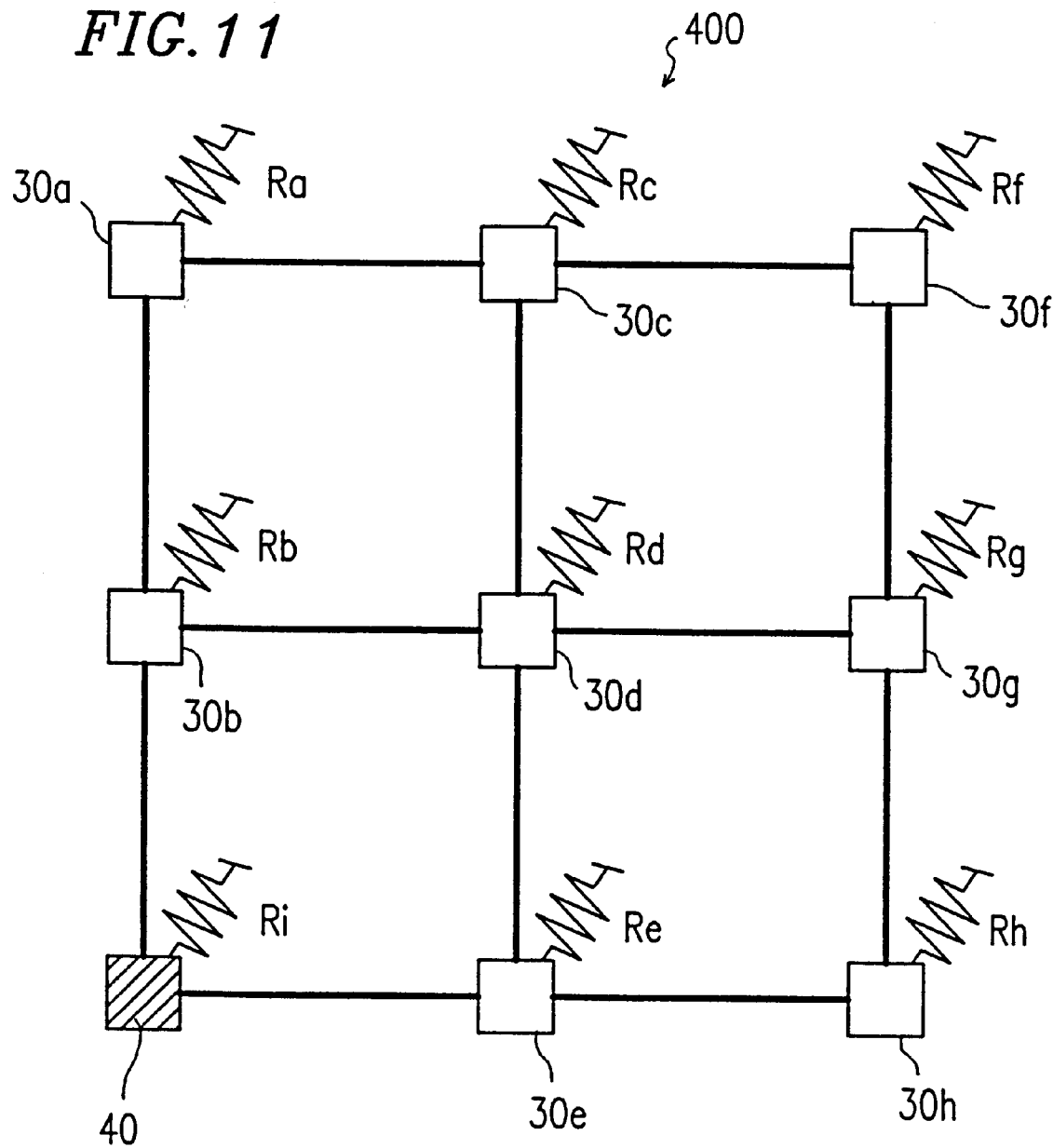

SEMICONDUCTOR MOUNTING SYSTEM AND SEMICONDUCTOR CHIP

BACKGROUND OF THE INVENTION

1. Field of the Invention

The present invention relates to a semiconductor chip in which a semiconductor integrated circuit is packaged and to a semiconductor mounting system including a plurality of semiconductor chips mounted therein.

2. Description of the Related Art

In recent years, there has been an increasing demand for high speed data transfer in a semiconductor integrated circuit (LSI) mounting system (hereinafter, referred to as the "semiconductor mounting system"). In order to meet the demand, it is necessary to operate signal lines at a high frequency in the semiconductor mounting system. It is accordingly necessary to account for a skew among the signals (particularly, a clock skew).

Conventionally, there have been provided various methods for accounting for a skew occurring in a high frequency system operation. As one of such methods, it has been proposed to provide pins only along one side (one edge) of a semiconductor device (IC chip) (e.g., U.S. Pat. No. 5,408, 123). Such a configuration allows for signal lines extending from a controller (master chip) to the IC chip to have equal length, thereby reducing the difference in delay among signals.

It has also been proposed to provide a clock line which extends the length of a data bus and then back again so that a clock signal and a data signal are transferred in the same direction, thereby reducing the clock skew (e.g., U.S. Pat. No. 5,432,823). Moreover, the skew among signals is also reduced by controlling the timing at which the signals are output from the IC chip.

In the former conventional configuration, pins are provided only along one side (one edge) of an IC chip, thereby limiting the number of pins which can be provided. In such a configuration, it is difficult to further improve the transfer rate by providing additional pins. Moreover, when IC chips are mounted in a complicated manner, it is difficult to arrange the signal lines so that a clock signal and a data signal are transferred in the same direction.

SUMMARY OF THE INVENTION

According to one aspect of this invention, a semiconductor mounting system includes a first semiconductor chip in which a first semiconductor integrated circuit is packaged and a second semiconductor chip in which a second semiconductor integrated circuit is packaged. The first semiconductor chip includes a plurality of first pins provided on a first surface and plurality of second pins provided on a second surface. The second semiconductor chip includes a plurality of third pins provided on a third surface and a plurality of fourth pins provided on a fourth surface. The semiconductor mounting system further includes: a plurality of first lines for electrically connecting the first pins with the third pins; and a plurality of second lines for electrically connecting the second pins with the fourth pins. A length of the first lines is substantially equal to a length of the second lines.

In one embodiment of the invention, the first surface is adjacent to the second surface, and the third surface is adjacent to the fourth surface.

In one embodiment of the invention, the first surface opposes the second surface, and the third surface opposes the fourth surface.

In one embodiment of the invention, the semiconductor mounting system further includes: a first substrate on which the first lines are provided; and a second substrate on which the second lines are provided. At least one of the first substrate and the second substrate includes a groove for mounting at least one of the first semiconductor chip and the second semiconductor chip.

In one embodiment of the invention, the first semiconductor chip further includes a plurality of first pads which are electrically connected to the first pins via a plurality of first wires. The second semiconductor chip further includes a plurality of second pads which are electrically connected to the second pins via a plurality of second wires. A length of each of the first wires is substantially equal to a length of each of the second wires.

According to another aspect of this invention, a semiconductor mounting system includes a semiconductor chip in which a semiconductor integrated circuit is packaged. The semiconductor chip includes a plurality of first pins provided on a first surface and a plurality of second pins provided on a second surface. The semiconductor mounting system further includes: a plurality of first lines which are electrically connected to the first pins; and a plurality of second lines which are electrically connected to the second pins. A first plane on which the first lines are provided is substantially perpendicular to a second plane on which the second lines are provided.

In one embodiment of the invention, a direction in which the first lines extend is substantially parallel to a direction in which the second lines extend. The semiconductor chip is substantially perpendicular to at least one of the first plane and the second plane.

According to still another aspect of this invention, a semiconductor mounting system includes a first semiconductor chip in which a first semiconductor integrated circuit functioning as a master is packaged and a plurality of second semiconductor chips in each of which a second semiconductor integrated circuit functioning as a slave is packaged. The second semiconductor chips each include a plurality of first pins provided on a first surface; a plurality of second pins provided on a second surface which is adjacent to the first surface; and a synchronization circuit for synchronizing a plurality of signals respectively input to the first pins and for outputting the synchronized signals respectively to the second pins.

In one embodiment of the invention, a clock signal is input to one of the first pins, and the synchronization circuit performs a synchronization operation based on the clock signal.

In one embodiment of the invention, the semiconductor mounting system further includes a selection circuit for selecting one of: a first path for electrically connecting the first pins respectively with the second pins; and a second path for electrically connecting each of the first pins with the second semiconductor integrated circuit.

In one embodiment of the invention, the selection circuit selects one of the first path and the second path based on a selection signal supplied from the first semiconductor chip.

In one embodiment of the invention, each of the second semiconductor chips further includes a plurality of terminal resistors respectively corresponding to the first pins; and each of the terminal resistors is connected to corresponding one of the first pins based on the selection signal.

In one embodiment of the invention, the first semiconductor integrated circuit is a memory controller and the second semiconductor integrated circuit is a memory.

According to still another aspect of this invention, a semiconductor chip in which a semiconductor integrated circuit is packaged is provided. The semiconductor chip includes a plurality of first pins provided on a first surface; a plurality of second pins provided on a second surface which is adjacent to the first surface; and a synchronization circuit for synchronizing a plurality of signals respectively input to the first pins and for outputting the synchronized signals respectively to the second pins.

Thus, the invention described herein makes possible the advantages of: (1) providing a semiconductor chip and a semiconductor mounting system which realize a high transfer rate and reduce a clock skew; and (2) providing a semiconductor chip and a semiconductor mounting system which control a clock signal transfer path, thereby allowing data to be transferred among IC chips with no clock skew.

These and other advantages of the present invention will become apparent to those skilled in the art upon reading and understanding the following detailed description with reference to the accompanying figures.

BRIEF DESCRIPTION OF THE DRAWINGS

FIG. 1A is a diagram illustrating a configuration of a semiconductor mounting system according to Example 1 of the present invention;

FIG. 1B is a diagram for illustrating an example of how an IC chip is mounted in the semiconductor mounting system of FIG. 1A;

FIG. 11 is a diagram illustrating a configuration of a semiconductor mounting system according to Example 3 of the present invention;

DESCRIPTION OF THE PREFERRED EMBODIMENTS

Figure 2:
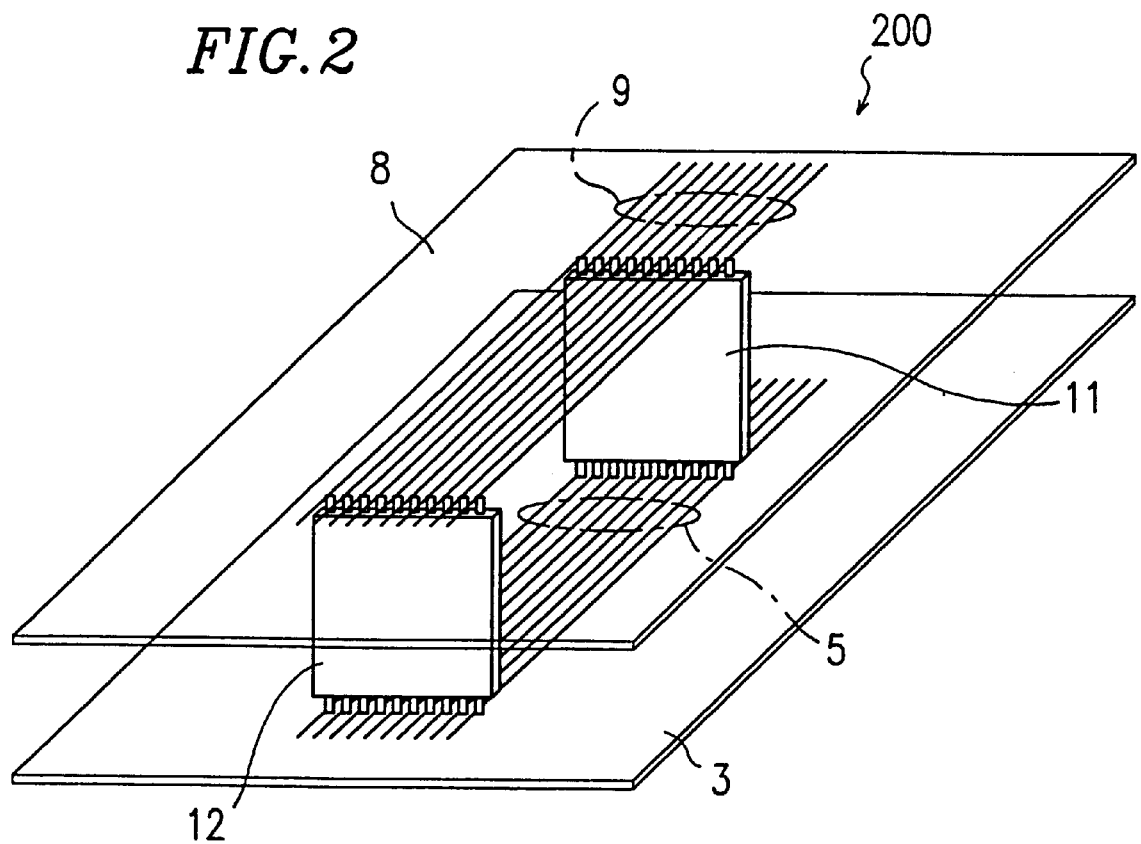
FIG. 2 is a diagram illustrating another configuration of a semiconductor mounting system according to Example 1 of the present invention.

Hereinafter, the present invention will be described by way of illustrative examples with reference to the accompanying figures.

EXAMPLE 1

In Example 1, a semiconductor mounting system including at least two semiconductor chips each including a semiconductor integrated circuit packaged therein (hereinafter, referred to as the "IC chips") will be described. Each IC chip has a plurality of pins provided along a first surface thereof and a plurality of pins provided along a second surface thereof. Herein, the "first surface" or the "second surface" of the IC chip refers to a side surface of the IC chip, wherein a side surface refers to one of the surfaces of the IC chip excluding those having the largest area.

FIG. 1A illustrates a configuration of a semiconductor mounting system 100 according to Example 1 of the present invention. As illustrated in FIG. 1A, the semiconductor mounting system 100 includes: an IC chip 1; another IC chip 2; a plurality of lines 5 for electrically connecting the pins provided on a first surface of the IC chip 1 with the pins provided on a first surface of the IC chip 2; and a plurality of lines 6 for electrically connecting the pins provided on a second surface of the IC chip 1 with the pins provided on a second surface of the IC chip 2. The lines 5 are provided on a printed board 3, and the lines 6 are provided on another printed board 4. For example, the IC chip 1 may be a memory, with the IC chip 2 being a memory controller for controlling the memory.

It is assumed in the following exemplary description that the IC chip 1 is a memory and the IC chip 2 is a memory controller.

In order to transfer data to/from the IC chip 1 at a high transfer rate, it is necessary to operate signal lines based on a clock signal having a high frequency. However, when a plurality of signal lines are operated at a high frequency, a clock skew will occur due to the line length difference among various signal lines. Such a clock skew can be prevented by equalizing the lengths of different signal lines. As described above, according to the conventional method, pins are provided only along one side (one edge) of an IC chip, thereby limiting the number of pins which can be provided. In such a case, it is difficult to further improve the signal transfer rate.

In the present example, a plurality of pins are provided along two side surfaces of the IC chip 1, and a plurality of pins are also provided along two side surfaces of the IC chip 2. The IC chip 1 and the IC chip 2 are mounted in such a manner that the plane on which the lines 5 are provided (the printed board 3) and the plane on which the lines 6 are provided (the printed board 4) are substantially perpendicular to each other. In each of the IC chips 1 and 2, the side surfaces along which a plurality of pins are provided are adjacent to each other. Due to such a configuration, the length of the lines 5 is substantially equal to the length of the lines 6 between the IC chips 1 and 2.

More specifically, each of the pins on the IC chip 1 is located at an equal distance from the corresponding pin on the IC chip 2. Thus, the length of the lines 5 is substantially equal to the length of the lines 6 between the IC chips 1 and 2, thereby preventing a clock skew from occurring due to the line length difference. Moreover, the data transfer rate between the IC chip 1 and the IC chip 2 can be improved by providing additional pins and additional lines.

When mounting the IC chip 1 and the IC chip 2 in a three-dimensional configuration as illustrated in FIG. 1A, it is important to mount the IC chip 1 and the IC chip 2 accurately perpendicularly to the printed board 3 so that the length of the lines 5 and the length of the lines 6 are accurately matched with each other.

FIG. 1B illustrates an example of the printed board 4 provided with a groove 7. The groove 7 is provided on the printed board 4 so as to extend in a direction perpendicular to the direction in which the lines 6 extend. After the printed board 3 and the printed board 4 are mounted perpendicularly to each other, the IC chip 1 and the IC chip 2 are inserted along the grooves 7 in the printed board 4. Thus, the IC chip 1 and the IC chip 2 can be easily mounted to be accurately perpendicular to the printed board 3. As a result, the length of the lines 5 can be easily and accurately matched with the length of the lines 6 between the IC chips 1 and 2.

Moreover, the groove 7 may also be provided on the printed board 3 as well as on the printed board 4. By providing the groove 7 on both printed boards 3 and 4, the IC chip 1 and the IC chip 2 can be positioned even more accurately.

In FIGS. 1A and 1B, pins are provided along two adjacent side surfaces of the IC chip. However, the present invention is not limited to such a configuration. Alternatively, for example, the pins can be provided on two side surfaces of the IC chip which oppose each other.

FIG. 2 illustrates a semiconductor mounting system 200 including an IC chip 11 and an IC chip 12 where pins are provided on two opposing side surfaces thereof.

As illustrated in FIG. 2, the semiconductor mounting system 200 includes: the IC chip 11; the other IC chip 12; a plurality of lines 5 for electrically connecting the pins provided on the first surface of the IC chip 11 with the pins provided on the first surface of the IC chip 12; and a plurality of lines 9 for electrically connecting the pins provided on a third surface of the IC chip 11 with the pins provided on a third surface of the IC chip 12. The first surface and the third surface oppose each other.

The surface opposing the first surface of the IC chip is referred to as the "third surface" and is distinguished from the "second surface" as defined above in connection with the semiconductor mounting system 100. The lines 5 are provided on the printed board 3, and the lines 9 are provided on a printed board 8. For example, the IC chip 11 may be a memory, with the IC chip 12 being a memory controller for controlling the memory.

As illustrated in FIG. 2, the printed board 3 and the printed board 8 are located in parallel with each other, and the IC chips 11 and 12 are mounted between the printed board 3 and the printed board 8. As illustrated in FIG. 2, a plurality of pins are provided along each of the upper and lower side surfaces of the IC chips 11 and 12. By arranging the printed board 3 and the printed board 8 in a three-dimensional configuration, it is possible to increase the number of lines provided while equalizing the length of the lines 5 and the length of the lines 9 between the IC chips 11 and 12.

In the semiconductor mounting system 200, as in the semiconductor mounting system 100, a groove (not shown) can be provided on one or both of the printed boards 3 and 8.

Figure 3:
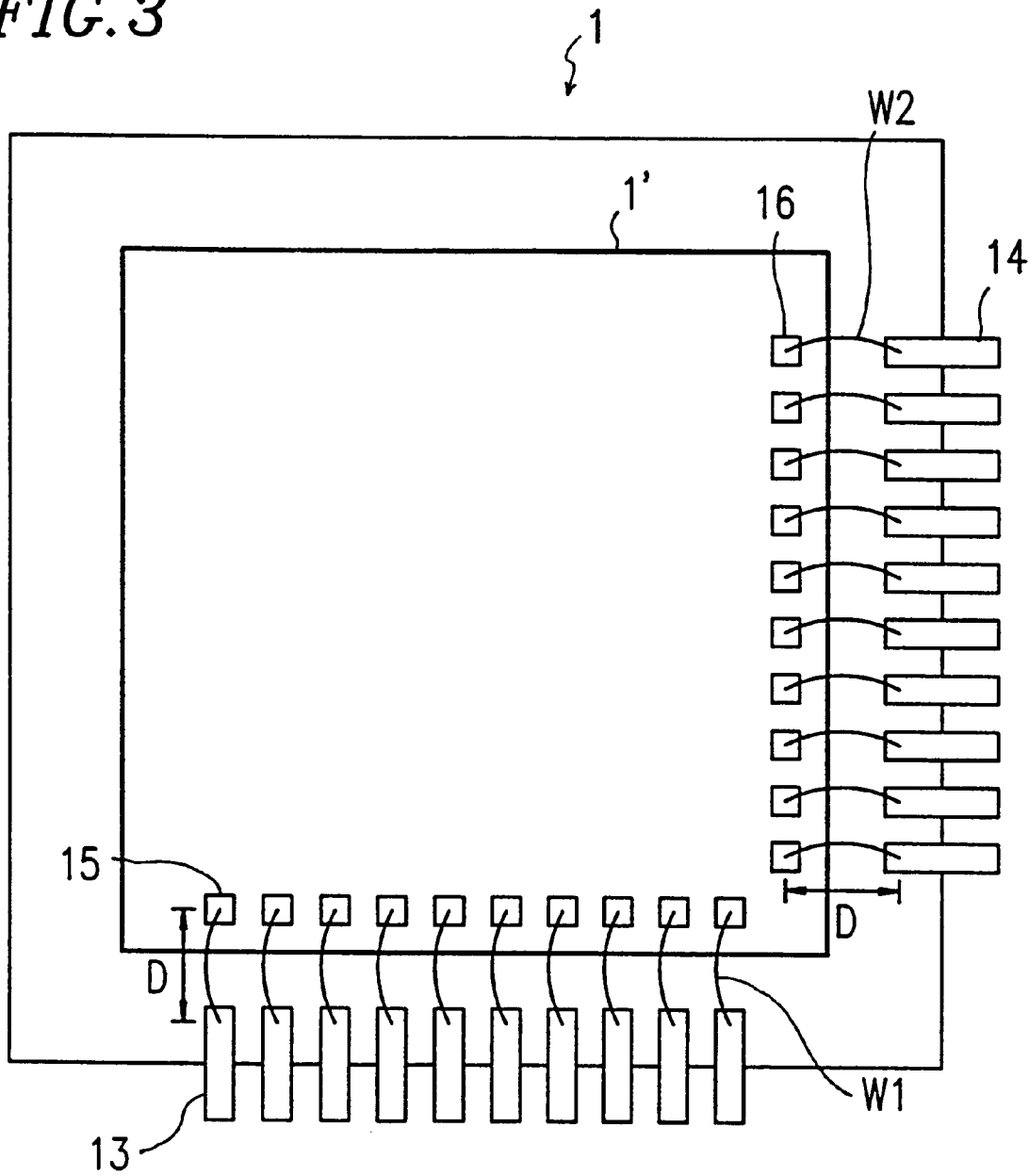
FIG. 3 is a diagram illustrating an internal structure of an IC chip according to Example 1 of the present invention.

FIG. 3 illustrates an internal structure of the IC chip 1. The IC chip 1 includes a silicon substrate 1'.

A plurality of pins 13 are provided along the first edge of the IC chip 1 so as to extend beyond the IC chip 1. A plurality of pins 14 are provided along the second edge (adjacent to the first edge) of the IC chip 1 so as to extend beyond the IC chip 1.

On the silicon substrate 1', a plurality of pads 15 are provided along the first edge of the IC chip 1, corresponding to the plurality of pins 13, while a plurality of pads 16 are provided along the second edge of the IC chip 1, corresponding to the plurality of pins 14. The plurality of pins 13 are each connected to the corresponding one of the pads 15 via a bonding wire W1, and the plurality of pins 14 are each connected to the corresponding one of the pads 16 via a bonding wire W2.

The spacing interval D between a pad and a corresponding pin is set to be identical to that between another pad and a corresponding pin. Moreover, the length of the bonding wire W1 is substantially the same as the length of the bonding wire W2. Thus, a skew among signals due to a line length difference is reduced.

The IC chip 2 has the same internal structure as that of the IC chip 1 illustrated in FIG. 3. Moreover, the IC chips 11 and 12 illustrated in FIG. 2 each have the same internal structure as that of the IC chips 1 and 2 except for the positional configuration of the pads and pins.

EXAMPLE 2

Figure 4:
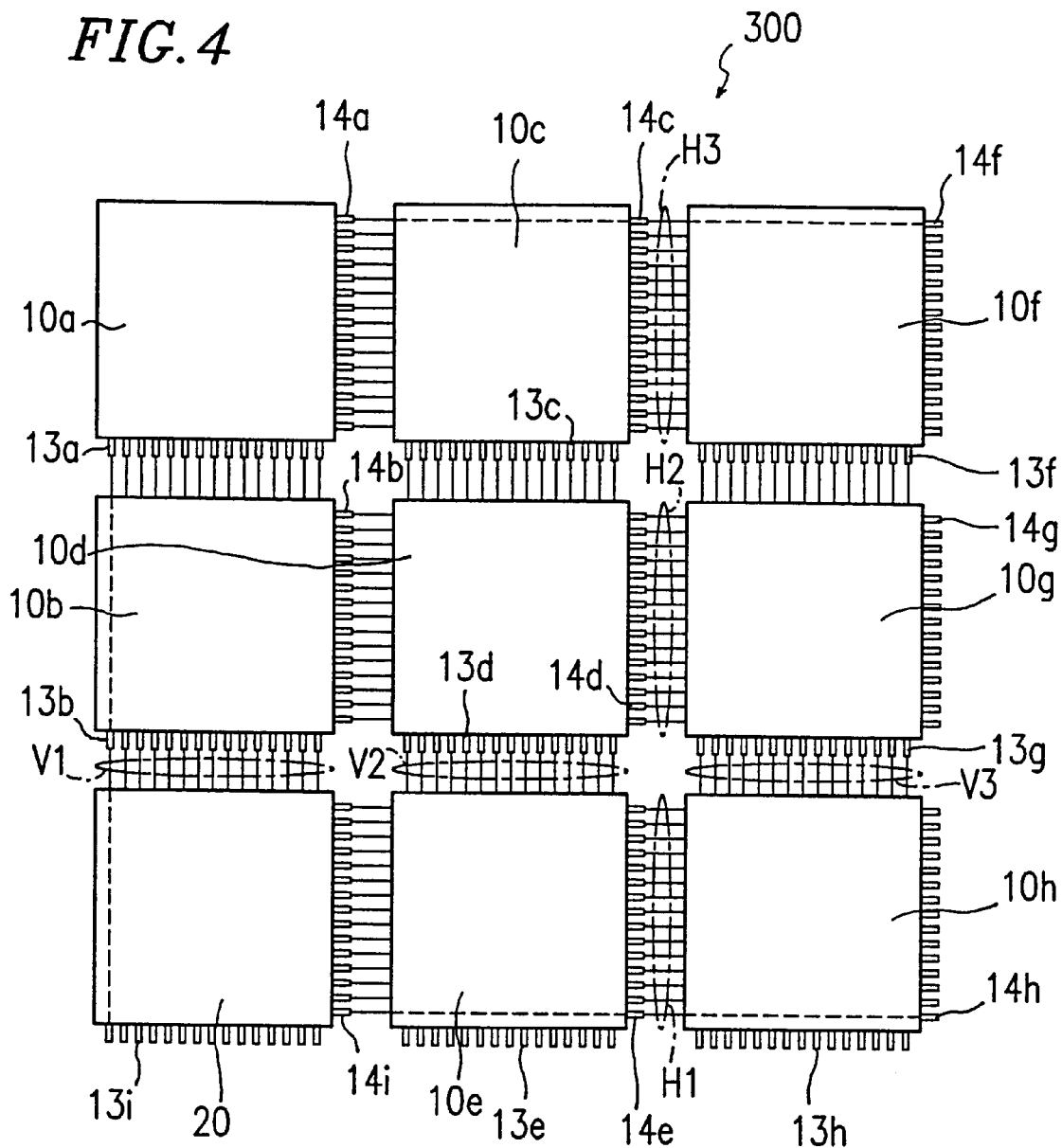
FIG. 4 is a diagram illustrating a configuration of a semiconductor mounting system according to Example 2 of the present invention.

FIG. 4 illustrates a configuration of a semiconductor mounting system 300 according to Example 2 of the present invention. The semiconductor mounting system 300 includes an IC chip 20 serving as a master and a plurality of IC chips 10a to 10h serving as slaves. It is assumed in the following exemplary description that the IC chip 20 is a memory controller, with the IC chips 10a to 10h each being a memory.

The memory controller 20 and the memories 10a to 10h are arranged in a matrix on a single plane. As compared to the conventional linear configuration where IC chips are arranged in a linear (one-dimensional) configuration, the planar configuration of the present example, where IC chips are arranged in a planar (two-dimensional) configuration, is less restrictive in terms of the IC chip layout and has a smaller driven load capacity. In such a planar configuration, however, it is necessary to eliminate the skew between a signal transferred via an inner corner of the IC chip and a signal transferred via an outer corner thereof. In the present example, a synchronization circuit is provided in the IC chip so as to eliminate the skew among signals transferred between IC chips. The synchronization circuit will be described later with reference to FIGS. 10A and 10B.

As illustrated in FIG. 4, each of the memory controller 20 and the memories 10a to 10h has a plurality of pins provided on two side surfaces adjacent to each other.

The memory 10a includes a plurality of pins 13a provided on the lower (FIG. 4) side surface thereof and a plurality of pins 14a provided on the right (FIG. 4) side surface thereof. The other memories 10b to 10h each have the same pin configuration.

Similarly, the memory controller 20 includes a plurality of pins 13i provided on the lower (FIG. 4) side surface thereof and a plurality of pins 14i provided on the right (FIG. 4) side surface thereof.

The number of pins provided on a side surface of the IC chip is 15 in the example illustrated in FIG. 4, but the number of pins provided on one side surface is not limited to such a number.

The semiconductor mounting system 300 includes lines V1 to V3 extending in the vertical direction in FIG. 4 and lines H1 to H3 extending in the horizontal direction in FIG. 4. Thus, the lines V1 to V3 and the lines H1 to H3 extend in different directions, and preferably extend substantially perpendicularly to each other.

The lines V1 to V3 and the lines H1 to H3 are formed in different layers provided on the printed board, and are electrically insulated from each other.

The pins 13i provided on the memory controller 20, the pins 13a provided on the memory 10a and the pins 13b provided on the memory 10b are connected to the lines V1. The lines V1 extend under the memory controller 20 and the memory 10b.

Similarly, a plurality of pins 13c, 13d and 13e, respectively corresponding to the memories 10c, 10d and 10e, are connected to the lines V2, while a plurality of pins 13f, 13g and 13h, respectively corresponding to the memories 10f, 10g and 10h, are connected to the lines V3.

Pins 14i provided on the memory controller 20, pins 14e provided on the memory 10e and pins 14h provided or the memory 10h are connected to the lines H1. The lines H1 extend under the memory 10e and the memory 10h.

Similarly, a plurality of pins 14b, 14d and 14g, respectively corresponding to the memories 10b, 10d and 10g, are connected to the lines H2, while a plurality of pins 14a, 14c and 14f, respectively corresponding to the memories 10a, 10c and 10f, are connected to the lines H3.

The number of conductive lines included in each of the line groups V1, V2, V3, H1, H2 and H3 is equal to the number of pins provided on one side surface of the IC chip.

Figure 5:
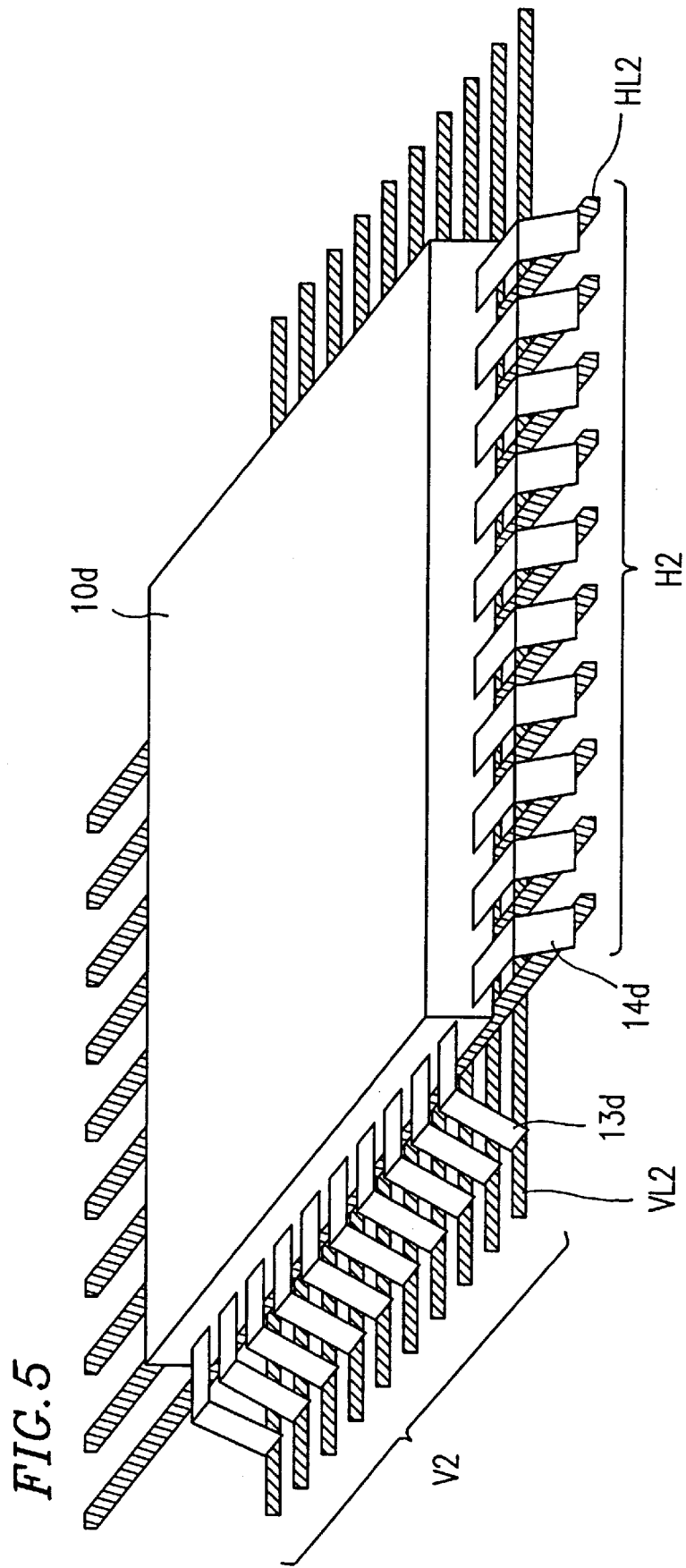
FIG. 5 is a diagram illustrating how an IC chip illustrated in FIG. 4 is connected to conductive lines.

FIG. 5 illustrates, in greater detail, how the memory 10d is connected with the lines V2 and H2. The other IC chips are each connected to the corresponding lines in the same manner.

The number of pins 13d provided in the memory 10d is equal to the number of conductive lines VL2 included in the group of lines V2, and the pins 13d of the memory 10d are connected to the conductive lines VL2 in a 1:1 correspondence. The number of pins 14d provided in the memory 10d is equal to the number of conductive lines HL2 included in the group of lines H2, and the pins 14d of the memory 10d are connected to the conductive lines HL2 in a 1:1 correspondence.

The lines V2 connected to the pins 13d and the lines H2 connected to the pins 14d each extend under the memory 10d from one end to the opposite end thereof. The lines V2 and the lines H2 are formed in different layers provided on the printed board, and are electrically insulated from each other so as to prevent any short-circuiting therebetween.

Referring again to FIG. 4, the operation of the semiconductor mounting system 300 when the memory controller 20 accesses the memory 10b will be described.

The memory controller 20 outputs an address signal, a clock signal and a control signal to the pins 13i. The address signal, the clock signal and the control signal output from the memory controller 20 are input to the pins 13b of the memory 10b via the lines V1 connected to the pins 13i. In response to the control signal, the memory 10b outputs data stored in the memory 10b to the lines V1 via the pins 13b. The location of the data in the memory 10b is designated by the address signal. The memory controller 20 receives the data output from the memory 10b via the lines V1, thus completing one access operation by the memory controller 20 to the memory 10b.

Hereinafter, the pins 13a to 13i provided on the first side surface of the IC chips will be generically called the "pin 13", and the pins 14a to 14i provided on the second side surface (adjacent to the first side surface) of the IC chips will be generically called the "pin 14".

Figure 6:
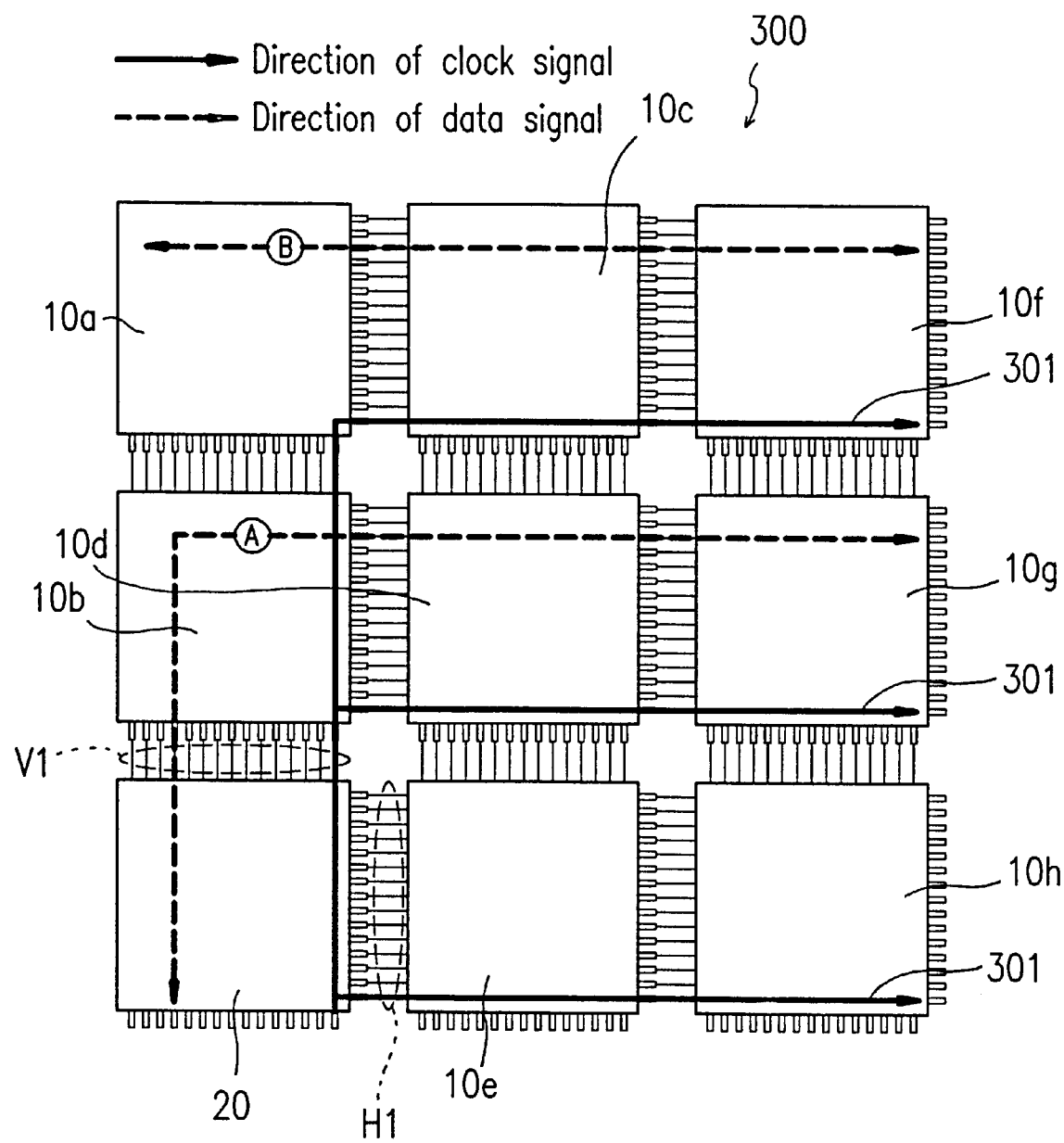
FIG. 6 is a diagram illustrating a clock signal transfer path and a data signal transfer path in a normal access state.

FIG. 6 illustrates an exemplary clock signal transfer path and an exemplary data signal transfer path in the semiconductor mounting system 300. The clock signal is supplied from the memory controller 20 to each of the memories 10a to 10h along an arrow 301 illustrated in FIG. 6. Such a state where the memory controller 20 accesses one of the memories 10a to 10h is called a "normal access state".

The memory controller 20 supplies a clock signal to the memory 10b via the line V1 and to the memory 10e via the line H1. The clock signal supplied to the memory 10b is then transferred to the memories 10a, 10c and 10f, successively. The clock signal supplied to the memory 10b is further transferred to the memories 10d and 10g, successively. The clock signal supplied to the memory 10e is further transferred to the memory 10h.

Thus, the memories 10c–10e are not directly connected to one another by the clock signal. Similarly, the memories 10f–10h are not directly connected to one another by the clock signal.

In the example illustrated in FIG. 6, the pins located closest to the lower right corner of the IC chip are assigned and used for supplying and transferring the clock signal. However, such pin assignment is not limited to this example, and any other pin of the IC chip can be assigned for transferring the clock signal.

When a data signal is transferred in the clock signal transfer direction 301, it is not necessary to account for the effect of the delay between the clock signal and the data signal. For example, assume that the transfer path for the clock signal is provided along the arrow 301 illustrated in FIG. 6. In such a case, when transferring a data signal from the memory controller 20 to the memory 10g, the direction of the data signal transfer path (indicated by an arrow "A" in FIG. 6) is identical to the direction of the clock signal transfer path. Also when transferring a data signal from the memory 10a to the memory 10f, the direction of the data signal transfer path (indicated by an arrow "B" in FIG. 6) is identical to the direction of the clock signal transfer path.

Figure 7:
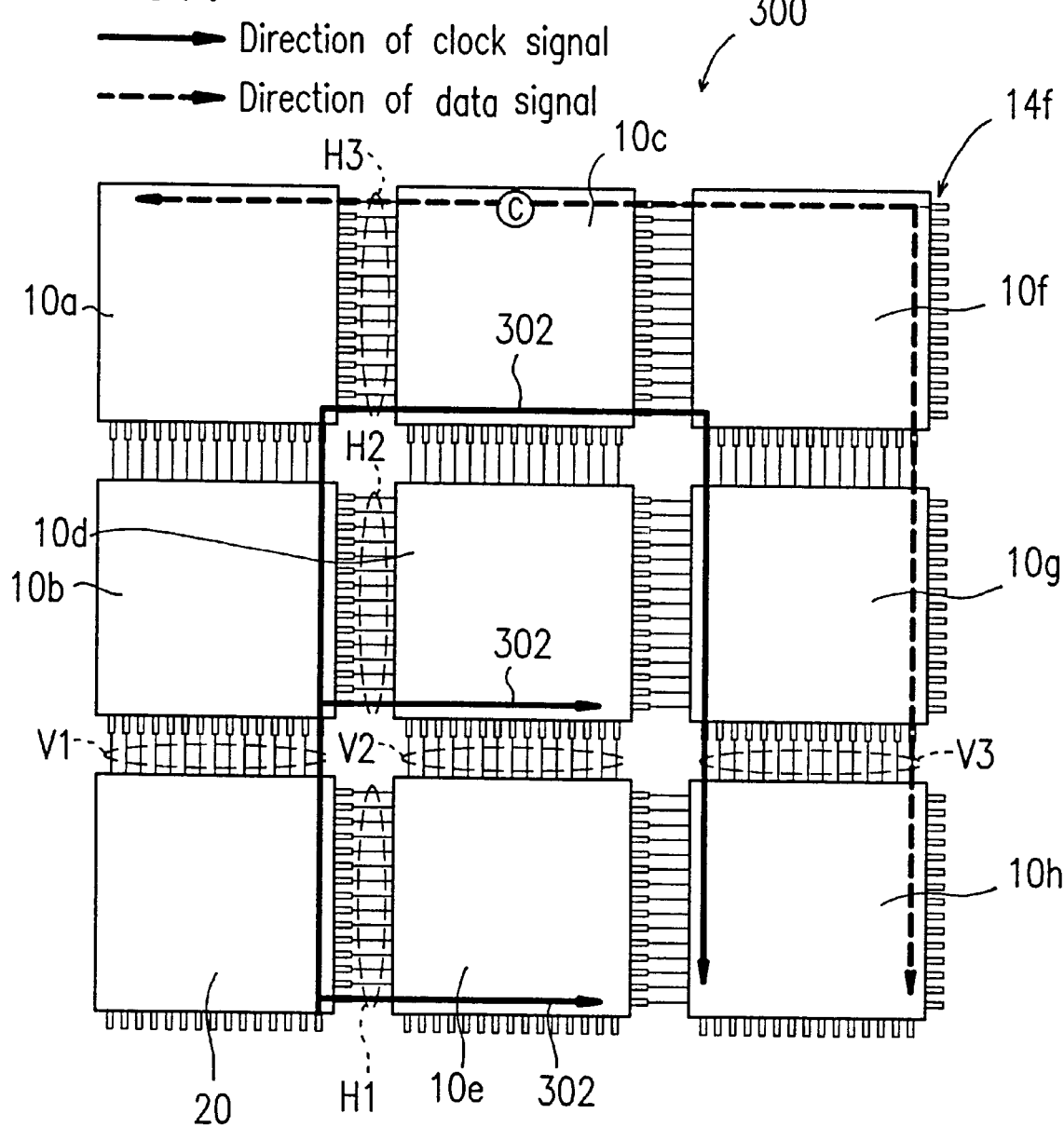
FIG. 7 is a diagram illustrating a clock signal transfer path and a data signal transfer path when transferring a data signal between two memories.

FIG. 7 illustrates an exemplary clock signal transfer path and an exemplary data signal transfer path in a state different from the normal access state. For example, when transferring a data signal from the memory 10a to the memory 10h, the data signal is transferred along the transfer path indicated by an arrow C in FIG. 7 (i.e., from the memory 10a, through the memories 10c, 10f and 10g, to the memory 10h). In such a case, if a clock signal is transferred along the clock signal transfer path as indicated by the arrow 301 in FIG. 6, a difference in delay may occur between the clock signal and the data signal. If such a difference in delay occurs, the memory may malfunction. For example, a data signal is transferred to the memory 10g from the memory controller 20 via the memories 10b and 10d. The data signal transfer path is different from the clock signal transfer path indicated by the arrow 301 in FIG. 6. Moreover, to the memory 10h, a data signal is transferred from the memory controller 20 only via the memory 10e. This data signal transfer path is different from the clock signal transfer path indicated by the arrow 301 in FIG. 6.

In order to eliminate the difference in delay between a clock signal and a data signal, the clock signal transfer path can be altered as indicated by an arrow 302 in FIG. 7. In such a case, after the clock signal has been transferred from the memory controller 20 to the memory 10a via the memory 10b, the clock signal is transferred along the same direction as that of the data signal transfer path indicated by the arrow C in FIG. 7 (i.e., from the memory 10a, through the memories 10c, 10f and 10g, to the memory 10h). Since the clock signal and the data signal are transferred in the same direction, the difference in delay therebetween can be eliminated, thereby preventing the memory from malfunctioning.

Such selection and setting of the clock signal transfer path are performed during a set-up period before the data signals are transferred. During the set-up period, data signal transfer information is sent to the memories 10a to 10h via the lines V1 to V3 and H1 to H3. Based on the data signal transfer information, a selection circuit provided in each of the memories 10a to 10h determines the clock signal transfer path. The selection circuit will be described later in detail.

Alternatively, it is also possible to estimate skews resulting when transferring a clock signal between the memory controller 20 and each of the memories 10a to 10h, so that the clock signal transfer path can be determined based on the estimated skew. The skew estimation is performed by, for example, supplying a clock signal from the memory controller 20 to each of the memories 10a to 10h via a clock signal line and sending back the clock signal from the memory 10a to 10h to the memory controller 20 via a different one of the plurality of data signal lines. The data signal line used for sending back the clock signal may be selected by a select switch, for example. Thus, the respective skews of various clock signal transfer paths between memories can be estimated at once.

Figure 8:
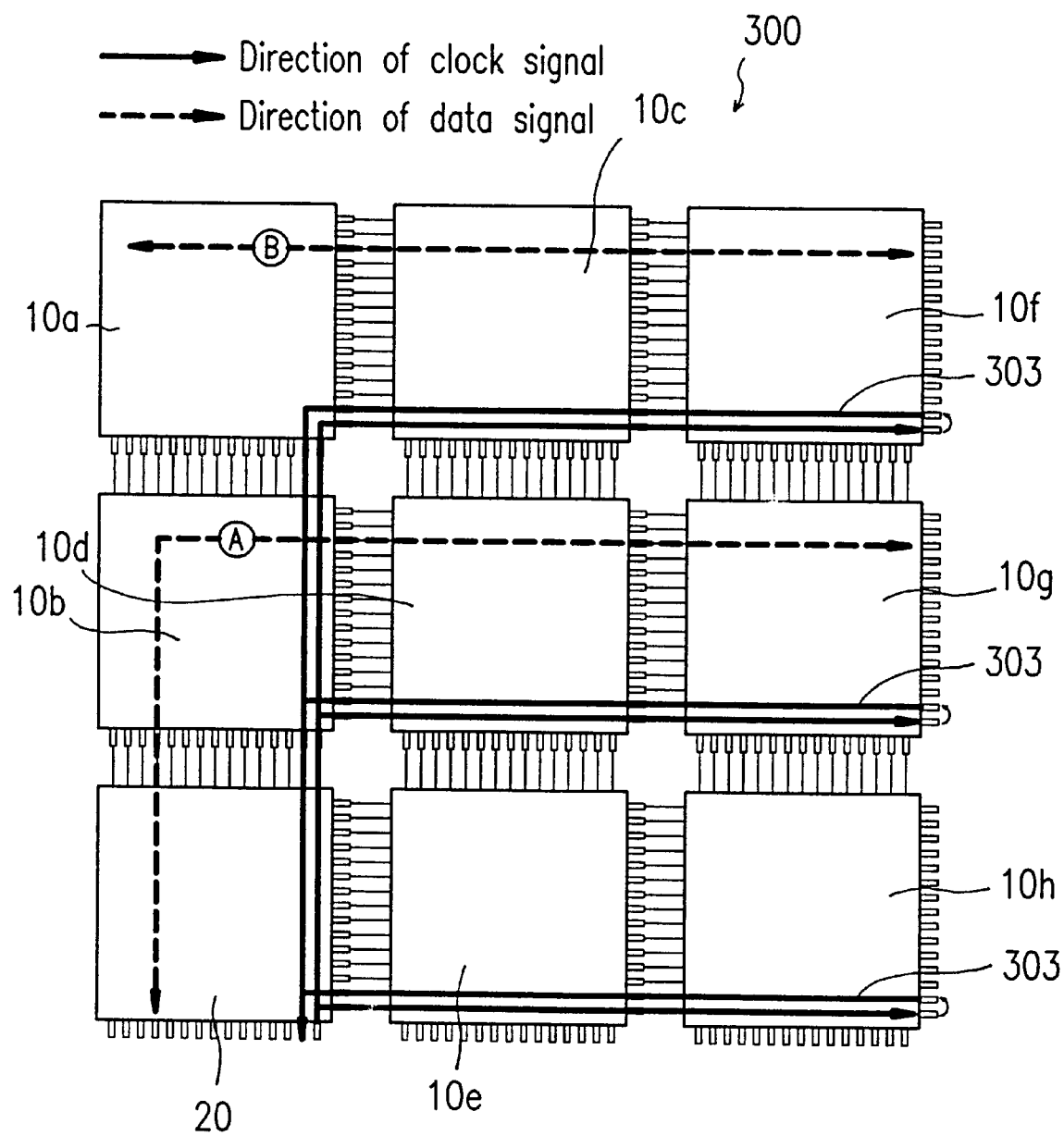
FIG. 8 is a diagram illustrating a clock signal transfer path and a data signal transfer path when transferring data in a direction opposite to that in the normal access state.

FIG. 8 illustrates clock signal transfer paths in the case where a data signal is transferred in a direction opposite to that of the normal transfer path (hereinafter, referred to as the "forward transfer path") for a clock signal supplied from the memory controller 20. In FIG. 8, the clock signal transfer path is indicated by an arrow 303.

For example, consider the case of transferring a data signal from the memory 10g to the memory controller 20 along the path indicated by the arrow A in FIG. 8 and the case of transferring a data signal from the memory 10f to the memory 10a along the path indicated by the arrow B in FIG. 8. In such cases, the clock signal is returned in a reverse direction by the memories 10f, 10g and 10h (at the end of the clock signal transfer path 303 in the forward direction). For example, a reversed clock signal transfer path can be provided by using pins (and corresponding signal lines) next to the pins through which the clock signal is supplied in the forward direction. Thus, the clock signal transfer path 303 becomes a two-way path. Therefore, it is possible to prevent a skew between a data signal and a clock signal, regardless of the direction in which the data signal is transferred along the clock signal transfer path 303.

Figure 9:
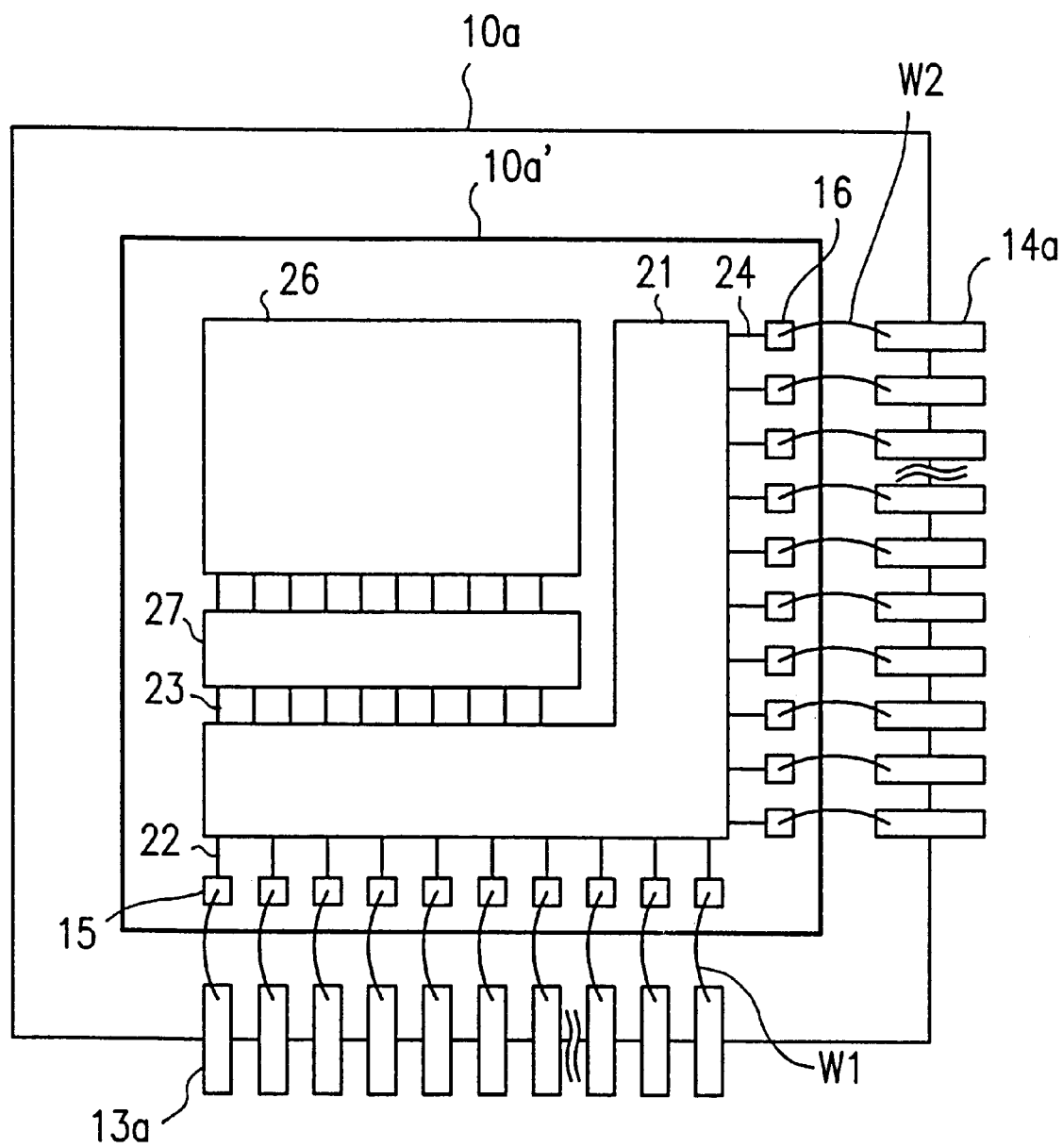
FIG. 9 is a diagram illustrating an internal structure of an IC chip having a selection circuit according to Example 2 of the present invention.

FIG. 9 illustrates an exemplary internal structure of the memory 10a. The memories 10b to 10h each have the same internal structure as that of the memory 10a.

The memory 10a includes a silicon substrate 10a'. A memory block 26 including a plurality of memory cells (not shown), a peripheral circuit 27 for controlling an access to the memory block 26 and a selection circuit 21 are provided on the silicon substrate 10a'. The peripheral circuit 27 includes at least a sense amplifier and a decoder.

A plurality of pins 13a are provided along the first edge of the memory 10a so as to extend beyond the memory 10a. A plurality of pins 14a are provided along the second edge (adjacent to the first edge) of the memory 10a so as to extend beyond the memory 10a.

On the silicon substrate 10a', a plurality of pads 15 are provided along the first edge of the memory 10a, corresponding to the plurality of pins 13a, while a plurality of pads 16 are provided along the second edge of the memory 10a, corresponding to the plurality of pins 14a. The plurality of pins 13a are each connected to the corresponding one of the pads 15 via a bonding wire W1. The plurality of pins 14a are each connected to the corresponding one of the pads 16 via a bonding wire W2.

The pads 15 are connected to the selection circuit 21 via lines 22. The pads 16 are connected to the selection circuit 21 via lines 24. The selection circuit 21 is connected to the peripheral circuit 27 via lines 23.

Next, the operation of the selection circuit 21 will be described.

For example, when the memory is in the position of the memory 10b as illustrated in FIG. 6, signals are input thereto through the pins 13b. Hereinafter, the operation of the selection circuit 21 of the memory 10b will be described.

A signal input to the pin 13b is input to the selection circuit 21 via the bonding wire W1, the pad 15 and the line 22. When the input signal is a signal for accessing the memory 10b, the selection circuit 21 electrically connects the line 22 to the line 23. As a result, the input signal is supplied to the memory block 26 via the line 23 and the peripheral circuit 27. In this way, the memory block 26 in the memory 10b is accessed. On the other hand, when the input signal is not a signal for accessing the memory 10b, but is rather a signal to be transferred to the next memory 10d via the memory 10b (see the data signal transfer path indicated by the arrow A in FIG. 6), the selection circuit 21 electrically connects the line 22 to the line 24. As a result, the input signal is output from the pin 14b via the pad 16 and the bonding wire W2.

For example, when the memory is in the position of the memory 10f as illustrated in FIG. 7, signals are input thereto through the pins 14f. Hereinafter, the operation of the selection circuit 21 of the memory 10f will be described.

A signal input to the pin 14f is input to the selection circuit 21 via the bonding wire W2, the pad 16 and the line 24. When the input signal is a signal for accessing the memory 10f, the selection circuit 21 electrically connects the line 24 to the line 23. As a result, the input signal is supplied to the memory block 26 via the line 23 and the peripheral circuit 27. In this way, the memory block 26 in the memory 10f is accessed. On the other hand, when the input signal is not a signal for accessing the memory 10f, but is rather a signal to be transferred to the next memory 10g via the memory 10f (see the data signal transfer path indicated by the arrow C in FIG. 7), the selection circuit 21 electrically connects the line 24 to the line 22. As a result, the input signal is output from the pin 13f via the pad 15 and the bonding wire W1.

Figure 10A:
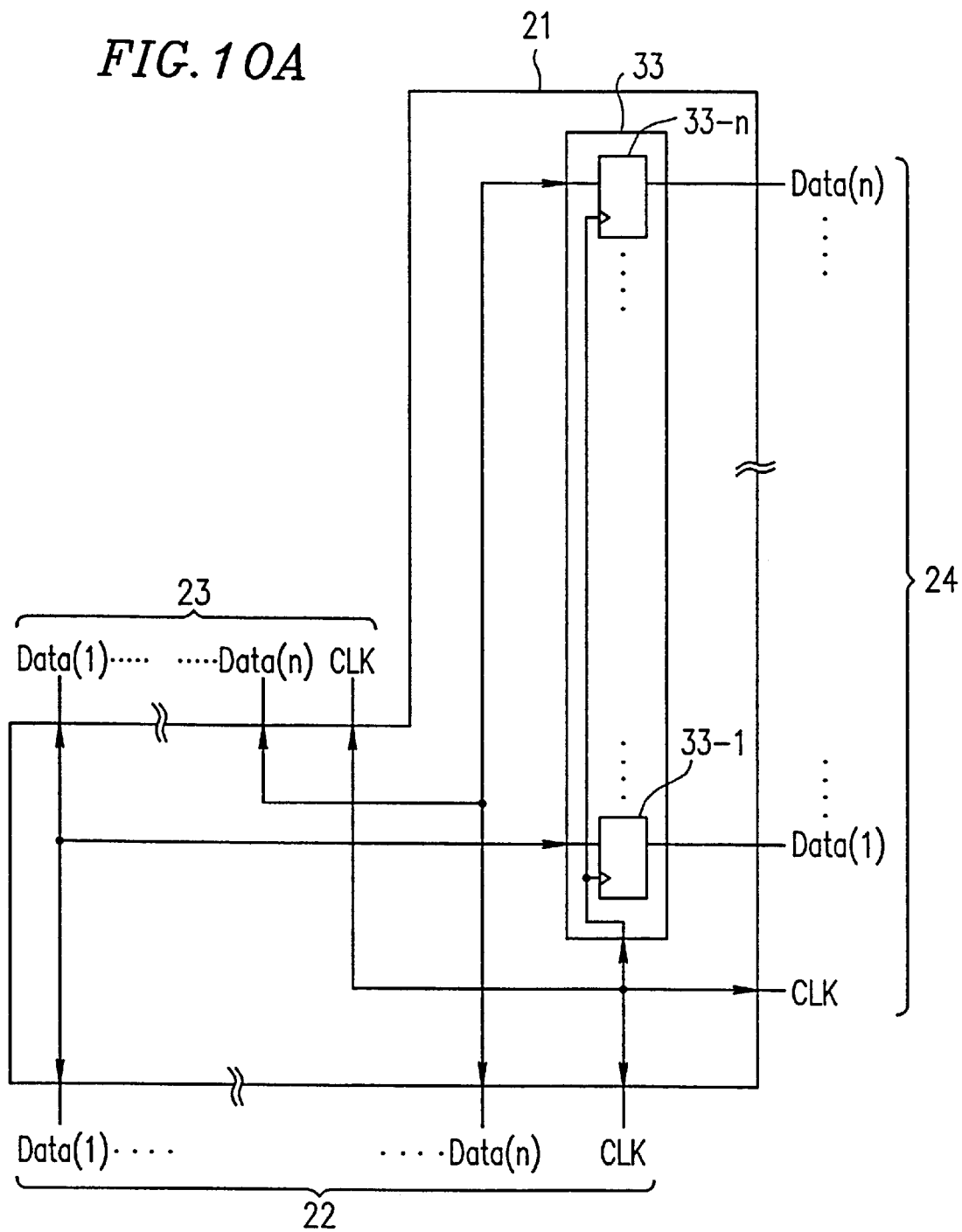
FIG. 10A is a block diagram illustrating an internal structure of the selection circuit.

FIG. 10A illustrates an exemplary configuration of the selection circuit 21. The lines 22, 23 and 24 each include n data signal lines for carrying data signals Data(1) to Data(n) and a single clock signal line for carrying a clock signal CLK.

The selection circuit 21 includes a synchronization circuit 33. The synchronization circuit 33 synchronizes the data signals Data(1) to Data(n) with the clock signal CLK on the lines 22 and outputs the synchronized signals to the lines 24. The synchronization circuit 33 also synchronizes the data signals Data(1) to Data(n) with the clock signal CLK on the lines 24 and outputs the synchronized signals to the lines 22. Such a synchronization function is achieved by latching data signals in latch circuits 33-1 to 33-n in response to the clock signal CLK.

Thus, it is possible to synchronize a plurality of signals input to the pins 13a (FIG. 9) and to output the synchronized signals to the pins 14a (FIG. 9). Moreover, it is possible to synchronize a plurality of signals input to the pins 14a (FIG. 9) and to output the synchronized signals to the pins 13a (FIG. 9). Such a synchronization function is essential when a plurality of memories are arranged in a planar configuration. With such a synchronization function, it is possible to reduce the skew occurring among signal lines depending on where the pin is located.

Figure 10B:
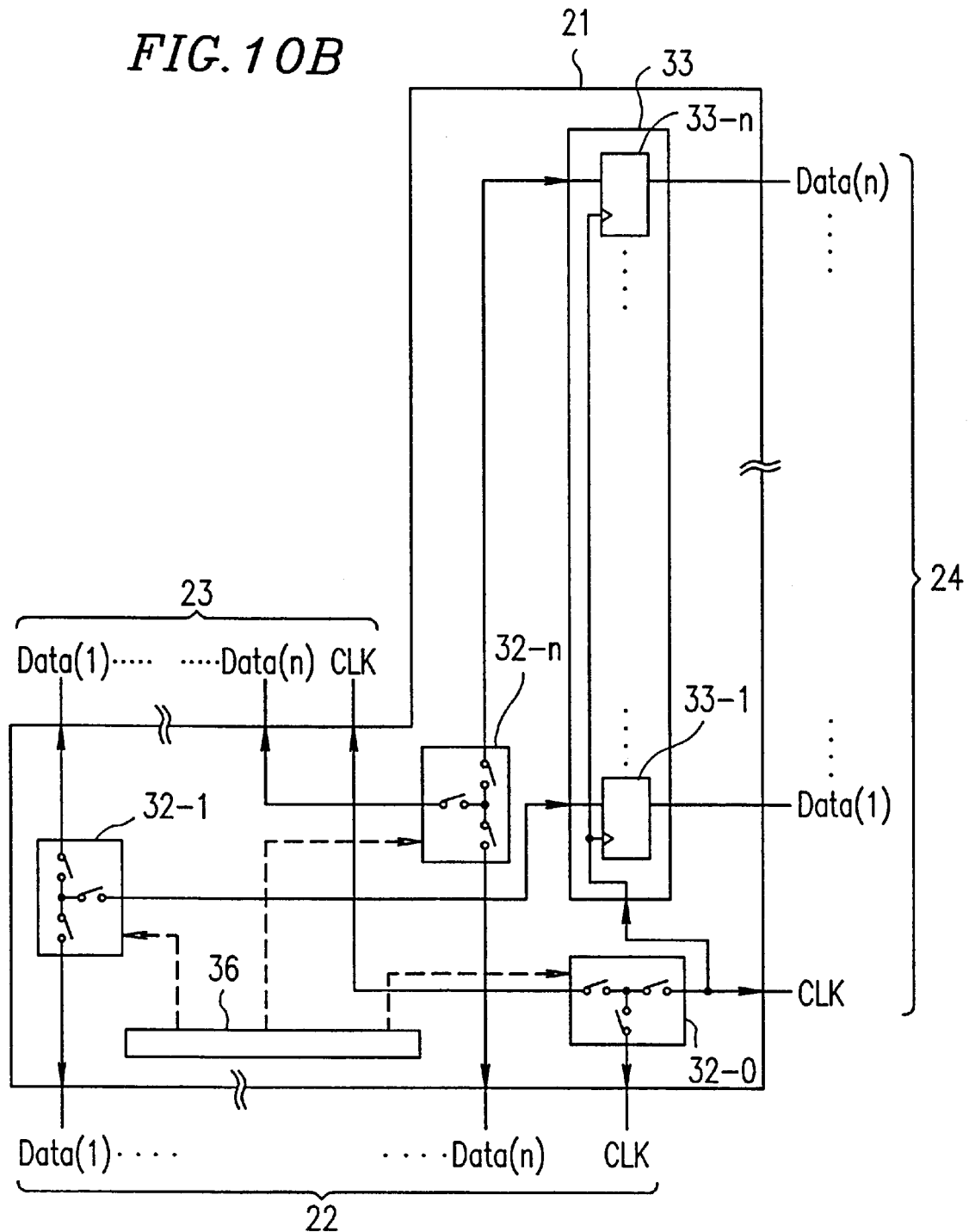
FIG. 10B is another block diagram illustrating an internal structure of the selection circuit.

FIG. 10B illustrates another configuration of the selection circuit 21. In addition to the components illustrated in FIG. 10A, the selection circuit 21 illustrated in FIG. 10B further includes selectors 32-0 to 32-n and a selector control circuit 36 for controlling the selectors 32-0 to 32-n.

The selectors 32-0 to 32-n each include three switches. A signal path can be altered by controlling (i.e., opening/closing) these switches.

The selector control circuit 36 controls the connection among the lines 22, 23 and 24 based on a control signal supplied from the memory controller 20. For example, when supplying a signal on the line 22 to the line 23, the selector control circuit 36 controls the selectors 32-0 to 32-n so as to electrically connect the line 22 with the line 23 while electrically insulating the line 22 from the line 24. When supplying a signal on the line 22 to the line 24, the selector control circuit 36 controls the selectors 32-0 to 32-n so as to electrically connect the line 22 with the line 24 while electrically insulating the line 22 from the line 23.

A control signal supplied from the memory controller 20 is input and stored in the selector control circuit 36 via the line 22 or the line 24 during a set-up period before transferring a data signal. Alternatively, the selector control circuit 36 may control the connection among the lines 22, 23 and 24 based on a chip select signal CS. The chip select signal CS is a signal which defines the activity/inactivity of the IC chip to which it is input. When the chip select signal CS is active, the selector control circuit 36 controls the selectors 32-0 to 32-n so as to electrically connect the line 22 with the line 23 while electrically insulating the line 22 from the line 24. When the chip select signal CS is inactive, the selector control circuit 36 controls the selectors 32-0 to 32-n so as to electrically connect the line 22 with the line 24 while electrically insulating the line 22 from the line 23.

In this way, the selectors 32-0 to 32-n select either one of: the first path for electrically connecting the pins 13a (FIG. 9) with the pins 14a (FIG. 9); and the second path for electrically connecting the pins 13a (FIG. 9) or the pins 14a (FIG. 9) with the memory block 26. Thus, it is possible to alter the signal path.

As described above, in the present example, the selection circuit 21 is provided in each IC chip so that the connection among the pins 13 and 14 and the memory block 26 is determined based on a control signal provided before transferring data. In the IC chip which is in the data transfer path, the signal input through the pin 13 (or 14) is directly output through the corresponding pin 14 (or 13). Thus, with the semiconductor mounting system 300 of the present example, the clock signal transfer and the data signal transfer are performed using the lines V1 to V3 and H1 to H3 and via an IC chip where the pin 13 and the pin 14 are short-circuited by the selection circuit 21.

Moreover, as described above, the first or second lines for connecting pins along an edge of an IC chip with pins along a corresponding edge of an adjacent IC chip have an equalized length, and the clock signal and data signal are transferred via the same tranfer path. The line length difference among pins in one IC chip is sufficiently smaller than that among IC chips. In the present example, a synchronization circuit 33 is provided in each IC chip. The data to be transferred is output by the synchronization circuit 33, in synchronization with the clock signal, from the IC chip which is in the transfer path.

Thus, there is provided a semiconductor mounting system in which the line length is equalized among different pins without limiting the number of pins which can be provided for one IC chip, thereby reducing a skew and a clock skew due to the line length difference.

EXAMPLE 3

Generally, when a low-amplitude signal is transferred at a high speed in a semiconductor mounting system, a resistor is inserted at the end of each line in order to keep a high-voltage state (e.g., about 5 V) so as to improve the transfer precision. When the signal transfer path is fixed as in the conventional configuration, this can be realized by simply providing a resistor at one end of a line. However, in the above-described configuration of Example 2, where the clock signal path is altered depending on the data transfer path (e.g., FIGS. 6 to 8), the end of the path is not fixed. In view of this phenomena, in the present example, the terminal resistors are switched from one to another in accordance with the switching of the clock signal transfer path.

FIG. 11 illustrates a configuration of a semiconductor mounting system 400 according to Example 3 of the present invention. As in Example 2, the semiconductor mounting system 400 includes nine IC chips 30a to 30h and 40. The IC chips are respectively provided with terminal resistors Ra to Ri. It is assumed in the following example that the IC chip 40 is a memory controller (or a clock signal source), with the IC chips 30a to 30h each being a memory. In the state before a signal is input to the semiconductor mounting system 400 (i.e., the initial state), each IC chip has a corresponding terminal resistor connected thereto, as illustrated in FIG. 11.

Figure 12:
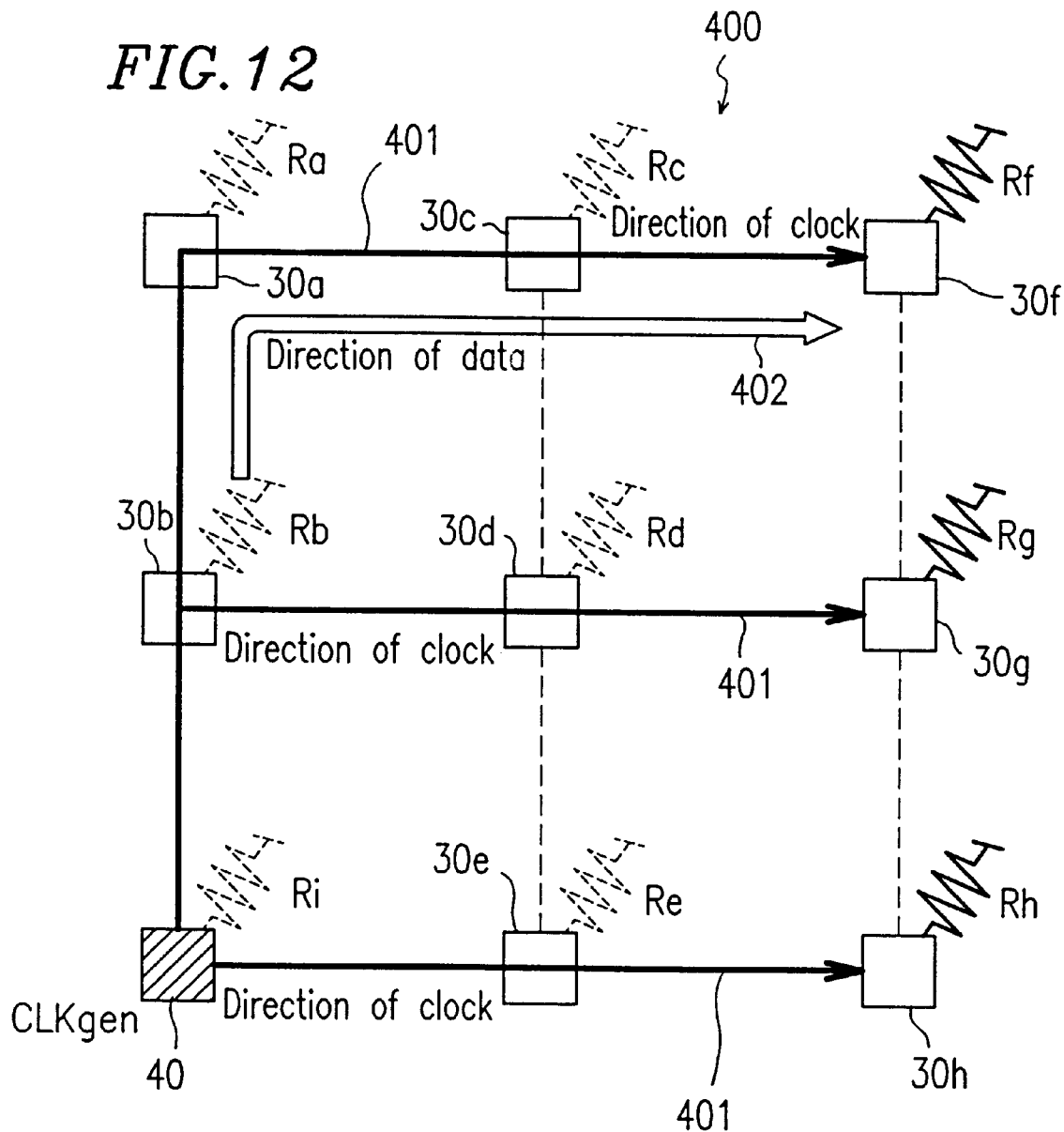
FIG. 12 is a diagram illustrating a clock signal transfer path and a terminal resistor arrangement in a normal access state.

FIG. 12 illustrates an exemplary clock signal transfer path and an exemplary data signal transfer path in the normal access state. In FIG. 12, a solid arrow 401 indicates the clock signal transfer path. In FIG. 12, the paths indicated by broken lines (e.g., one extending from the memory 30c, via the memory 30d, to the memory 30e) are not used. The data signal transfer path is indicated by an arrow 402. In such a normal access state, terminal resistors Rf to Rh are connected respectively to the memories 30f to 30h, which are each to be a terminal of a clock signal transfer path, while terminal resistors Ra to Re and Ri are disconnected respectively from the other memories 30a to 30e and the memory controller 40. In FIG. 12, a terminal resistor connected to the corresponding IC chip is shown in a solid line, while a terminal resistor disconnected from the corresponding IC chip is shown in a broken line. By controlling the connection/disconnection of terminal resistors as described above, it is possible to maintain a state where resistors are connected to only those IC chips which are each to be a terminal of a clock signal transfer path. Thus, signal transfer is performed precisely.

Next, a data transfer operation between two memories will be discussed.

Figure 13:
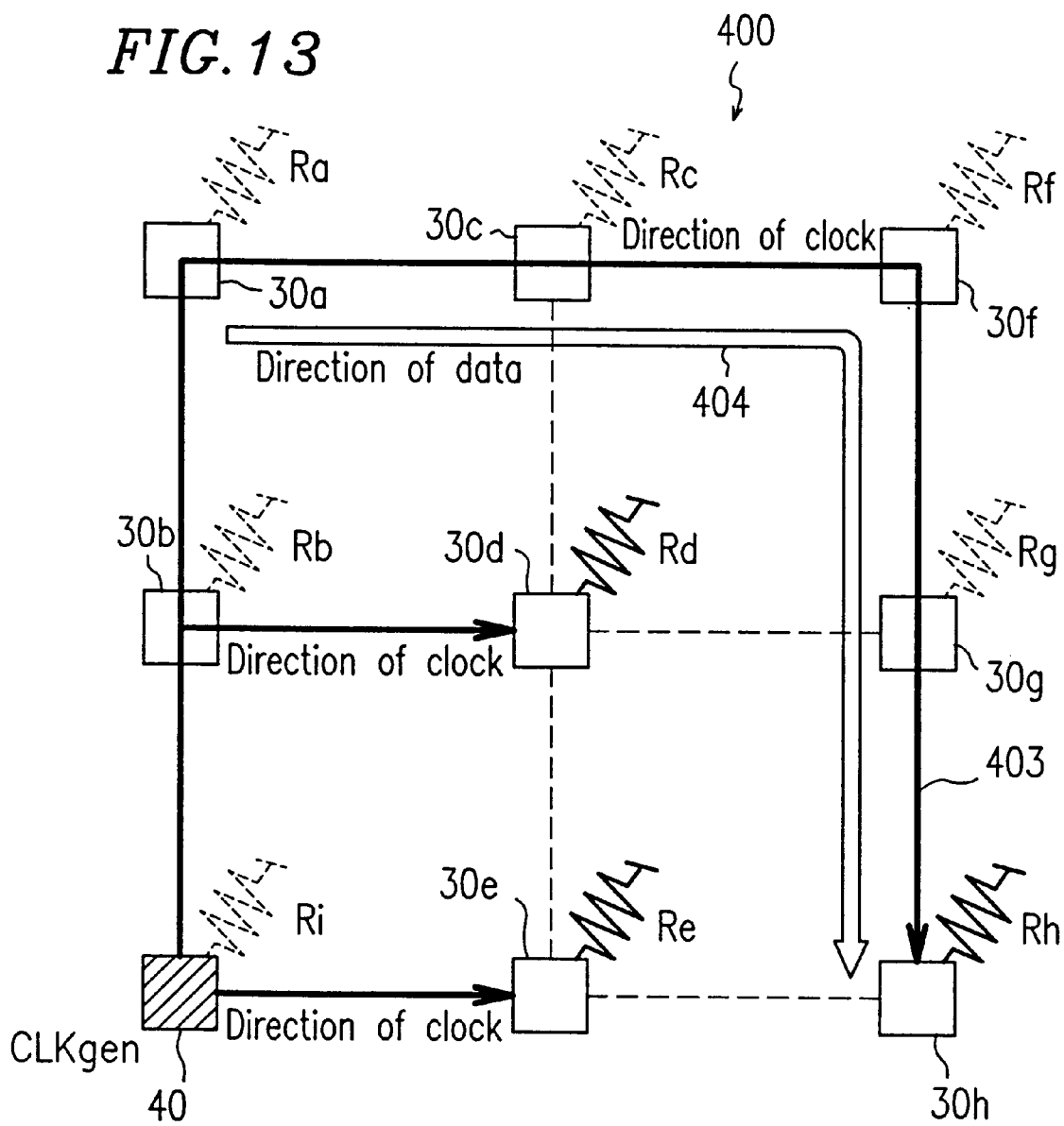
FIG. 13 is a diagram illustrating a clock signal transfer path and a terminal resistor arrangement when transferring a data signal between two memories.

FIG. 13 illustrates an exemplary clock signal transfer path and an exemplary data signal transfer path. In FIG. 13, a solid arrow 403 indicates the clock signal transfer path. In FIG. 13, the paths indicated by broken lines (e.g., one extending from the memory 30d to the memory 30e) are not used. The data signal transfer path is indicated by an arrow 404, and the data signal is transferred from the memory 30a to the memory 30h. Terminal resistors Rd, Re and Rh are connected respectively to the memories 30d, 30e and 30h, which are each to be a terminal of a clock signal transfer path, while terminal resistors Ra to Rc, Rf, Rg and Ri are disconnected respectively from the other memories 30a to 30c, 30f, 30g and the memory controller 40. In FIG. 13, a terminal resistor connected to the corresponding IC chip is shown in a solid line, while a terminal resistor disconnected from the corresponding IC chip is shown in a broken line. By controlling the connection/disconnection of terminal resistors as described above, it is possible to keep a state where resistors are connected to only those IC chips which are each to be a terminal of a clock signal transfer path. Thus, signal transfer is performed precisely.

Figure 14:
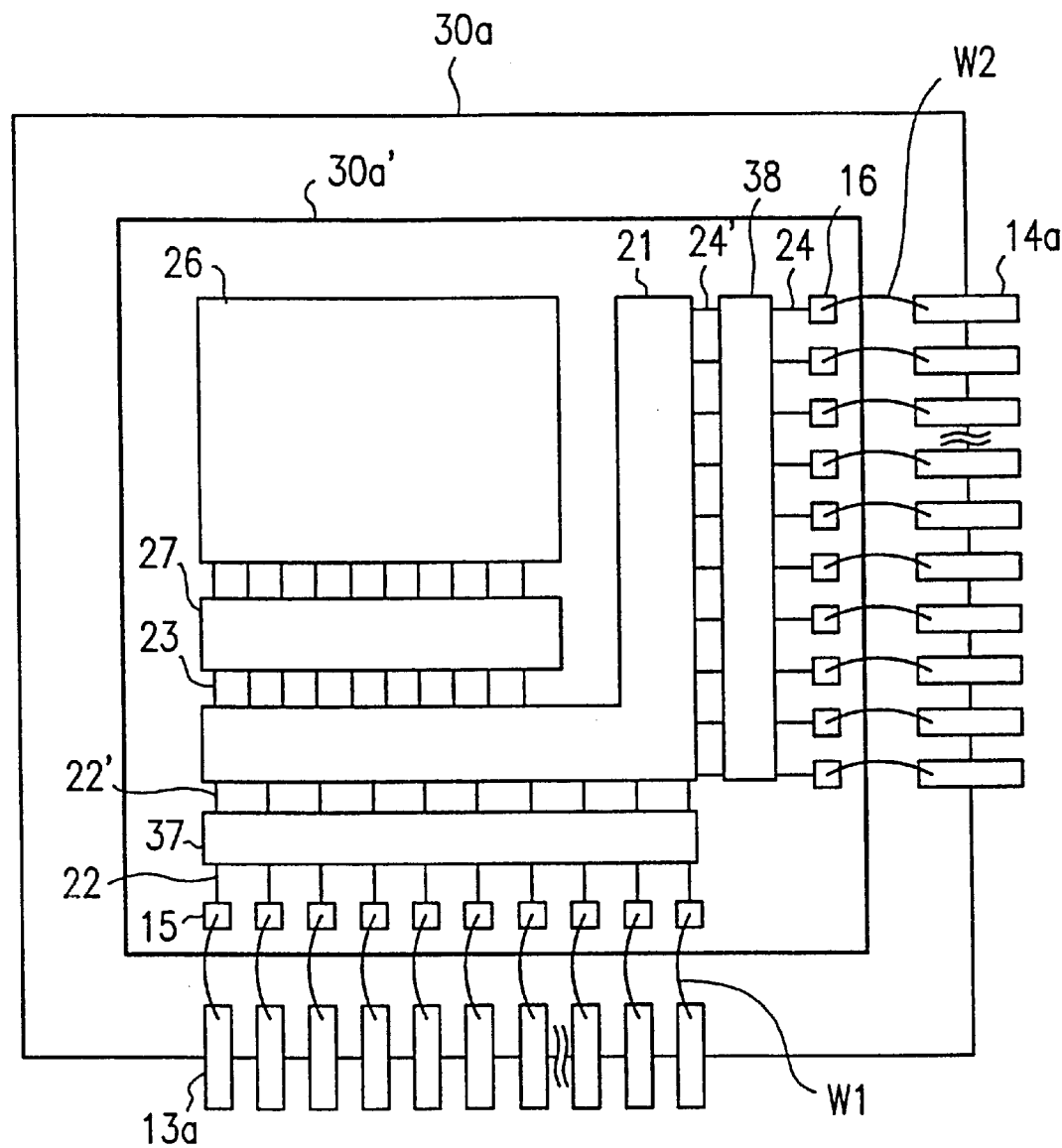
FIG. 14 is a diagram illustrating an internal structure of an IC chip provided with a terminal resistor switching circuit according to Example 3 of the present invention.

FIG. 14 illustrates an internal structure of the memory 30a having the terminal resistor switching function. The memories 30b to 30h and the memory controller 40 each have the same internal structure as that of the memory 30a.

In FIG. 14, components that are also shown in FIG. 9 are provided with the same reference numerals and will not be further described below.

The memory 30a includes a silicon substrate 30a'. On the substrate 30a', a first terminal resistor switching circuit 37 is provided between the pad 15 and the selection circuit 21, and a second terminal resistor switching circuit 38 is provided between the pad 16 and the selection circuit 21.

The first terminal resistor switching circuit 37 is connected to the pads 15 via the lines 22 and to the selection circuit 21 via the lines 22'. Similarly, the second terminal resistor switching circuit 38 is connected to the pads 16 via the lines 24 and to the selection circuit 21 via the lines 24'.

Figure 15:
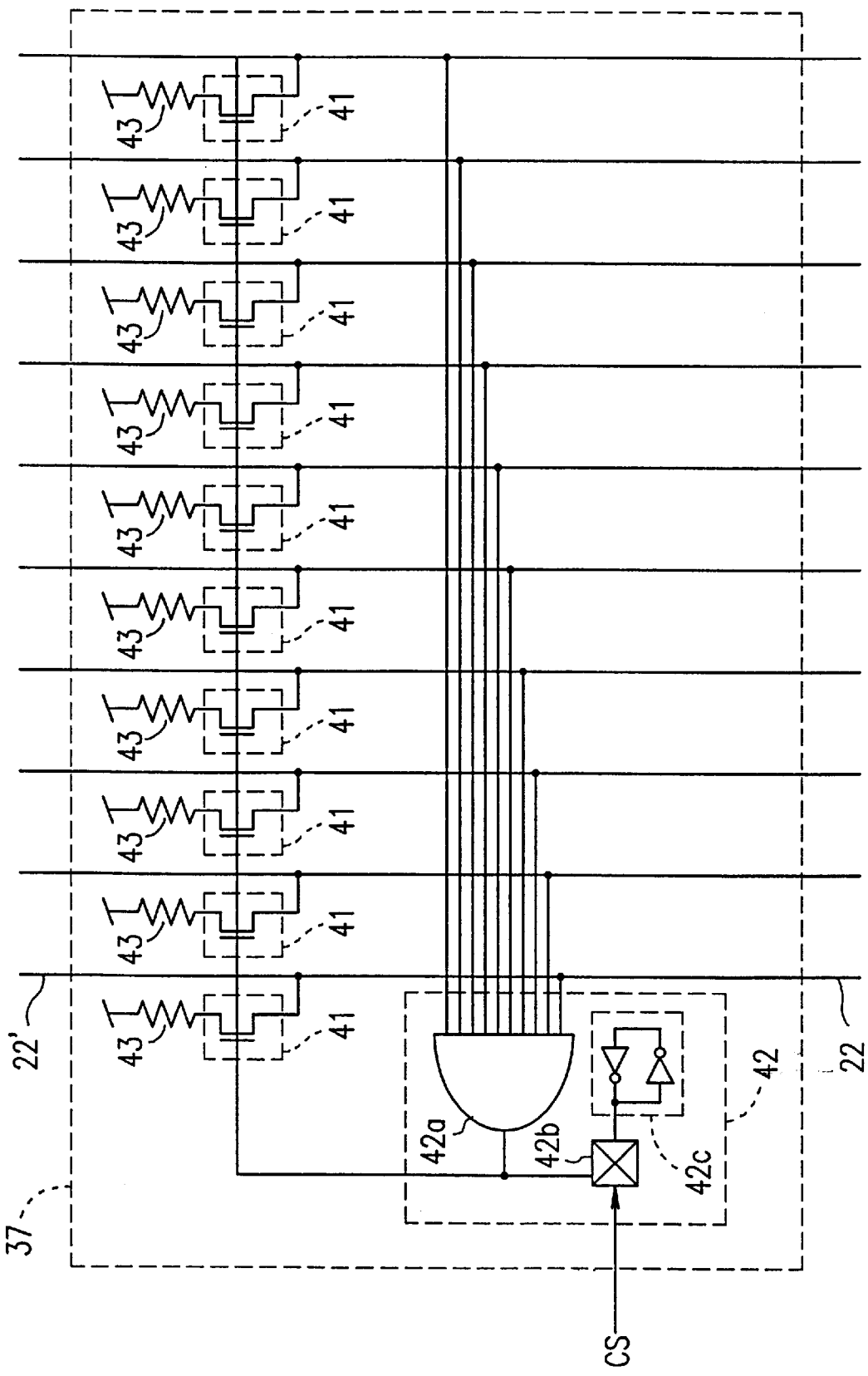
FIG. 15 is a diagram illustrating a configuration of the terminal resistor switching circuit.

FIG. 15 illustrates an internal structure of the terminal resistor switching circuit 37. The other terminal resistor switching circuit 38 preferably has the same internal structure as that of the terminal resistor switching circuit 37.

The terminal resistor R includes a plurality of resistor elements 43 corresponding to the lines 22 (22'). In the example illustrated in FIG. 15, the resistor element 43 is provided inside the terminal resistor switching circuit 37. Alternatively, the resistor element 43 may be provided outside the terminal resistor switching circuit 37. The resistor element 43 can be provided at any location as long as it is connected to the line 22 (22') via a terminal resistor selector 41.

The terminal resistor switching circuit 37 includes the terminal resistor selector 41 for selectively connecting the resistor element 43 to the line 22 (22'), and a resistor control circuit 42 for controlling the operation of the terminal resistor selector 41.

The switching of the terminal resistor R (resistor elements 43) is performed by inputting a control signal for switching of the terminal resistor from the line 22 to the resistor control circuit 42 during a set-up period before a data signal is transferred, as in the switching of the selectors 32-0 to 32-n by the selection circuit 21, as described in Example 2. When connecting the terminal resistor R to the corresponding IC chip, all the bits of the control signal are at H level. When disconnecting the terminal resistor R from the corresponding IC chip, any one of the bits of the control signal is at L level.

The resistor control circuit 42 includes an AND circuit 42a, a switch 42b and a latch circuit 42c. A chip select signal CS is input to the switch 42b. The switch 42b is closed when the chip select signal CS is active, whereby the control signal on the line 22 is input to the latch circuit 42c via the AND circuit 42a and the switch 42b, and held in the latch circuit 42c. While the chip select signal CS is active, the control signal held in the latch circuit 42c is supplied to the terminal resistor selector 41. The terminal resistor selector 41 is an NMOS transistor, for example.

When the IC chip is a terminal of a clock signal transfer path, the chip select signal CS input to the IC chip is active. In such a case, a control signal whose bits are all at H level is input to the resistor control circuit 42. As a result, while the chip select signal CS is active, the terminal resistor selector 41 is ON. Thus, the plurality of resistor elements 43 are connected to the lines 22 (22').

EXAMPLE 4

In Example 4 of the present invention, the three-dimensional mounting of IC chips of Example 1 is employed in the semiconductor mounting system of Example 2.

Figure 16A:
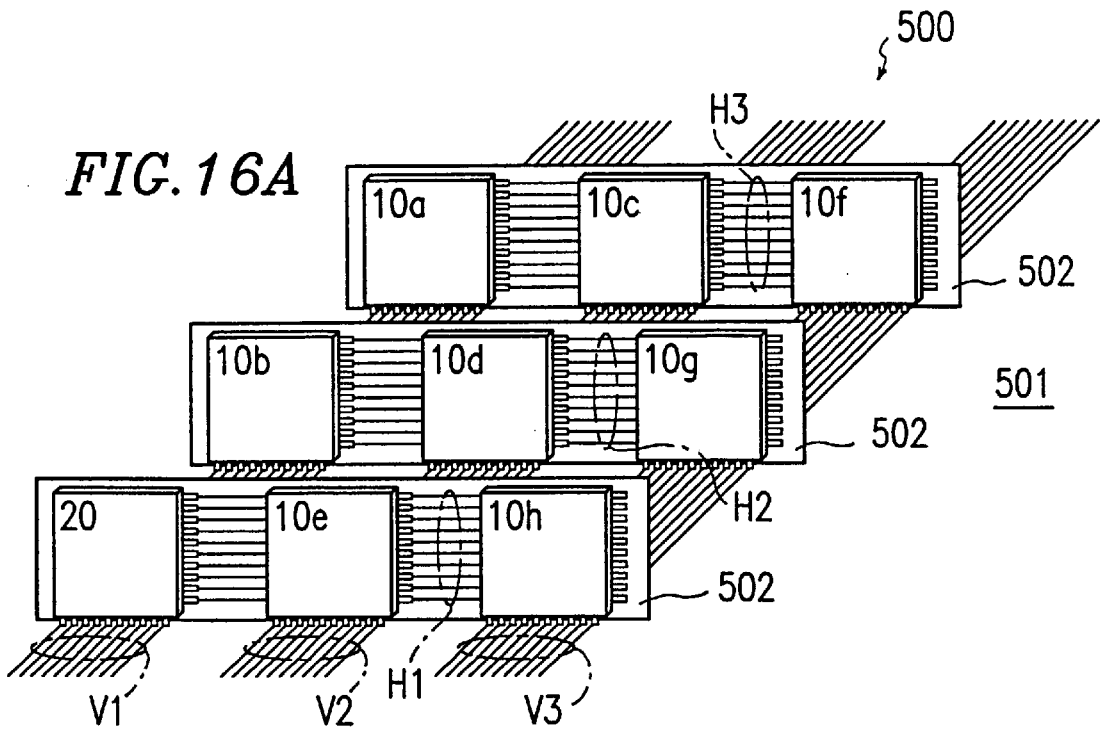
FIGS. 16A and 16B illustrate an exemplary configuration of a semiconductor mounting system in which IC chips are mounted in a three-dimensional arrangement.

FIG. 16A illustrates a configuration of a semiconductor mounting system 500 according to Example 4 of the present invention. The semiconductor mounting system 500 is obtained by mounting the IC chips 10a to 10h and 20 in the semiconductor mounting system 300 of FIG. 4 in a three-dimensional manner with respect to the lines V1 to V3. More preferably, the IC chips 10a to 10h and 20 are arranged substantially perpendicularly to the lines V1 to V3. A plane (printed boards) 502 on which the lines H1 to H3 are provided is substantially perpendicular to the plane (printed board) 501 on which the lines V1 to V3 are provided. As illustrated in FIG. 16A, the IC chips 10a to 10h and 20 are mounted so as to be substantially perpendicular to the plane 501 and substantially parallel to the plane 502.

The semiconductor mounting system 500 provides effects similar to those realized by the semiconductor mounting system 300 of Example 2. Moreover, it is not necessary to provide a multi-layer printed board on which the lines V1 to V3 and the lines H1 to H3 can be provided in different layers and thus insulated from each other, while the mounting area can also be reduced.

Figure 16B:
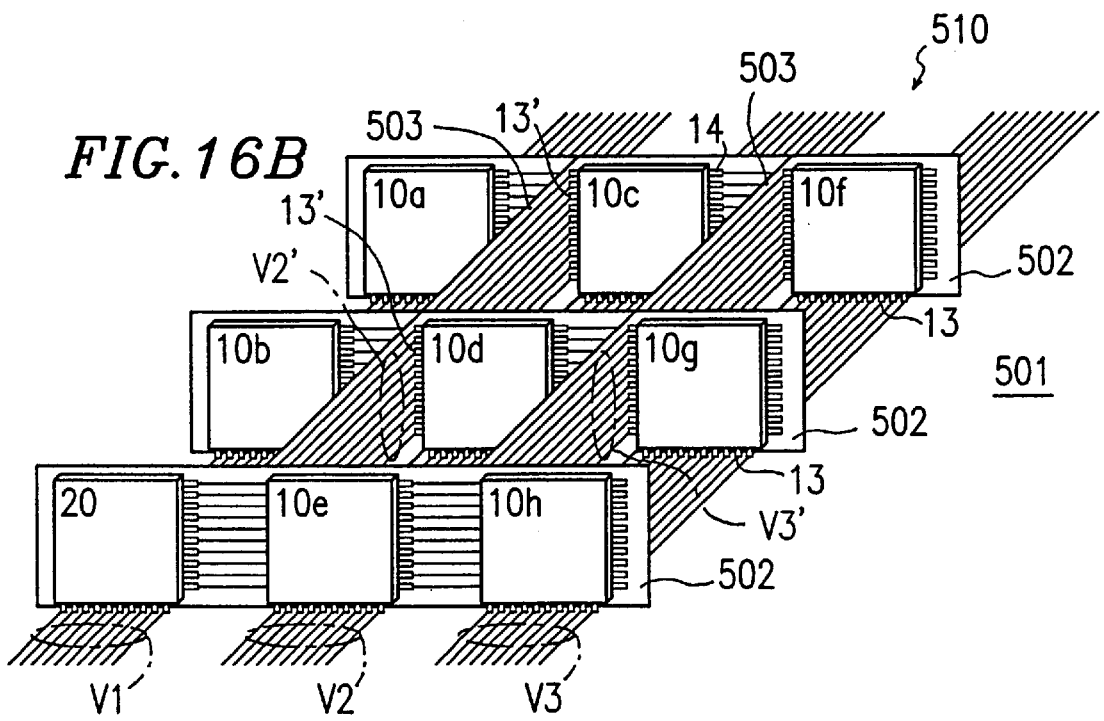

FIG. 16B illustrates a configuration of a semiconductor mounting system 510. In addition to the components provided in the semiconductor mounting system 500 of FIG. 16A, the semiconductor mounting system 510 further includes two printed boards 503 on which lines V2' and V3' are provided. As illustrated in FIG. 16B, it is possible to additionally provide a plurality of pins 13' on another side of the IC chips 10a to 10h and 20. In such a case, it is possible to equalize the length of line V2 between two IC chips (e.g., the IC chips 10c and 10d) to that of the line V2' therebetween. Thus, it is possible to realize the effects similar to those described in Example 1.

Figure 17:
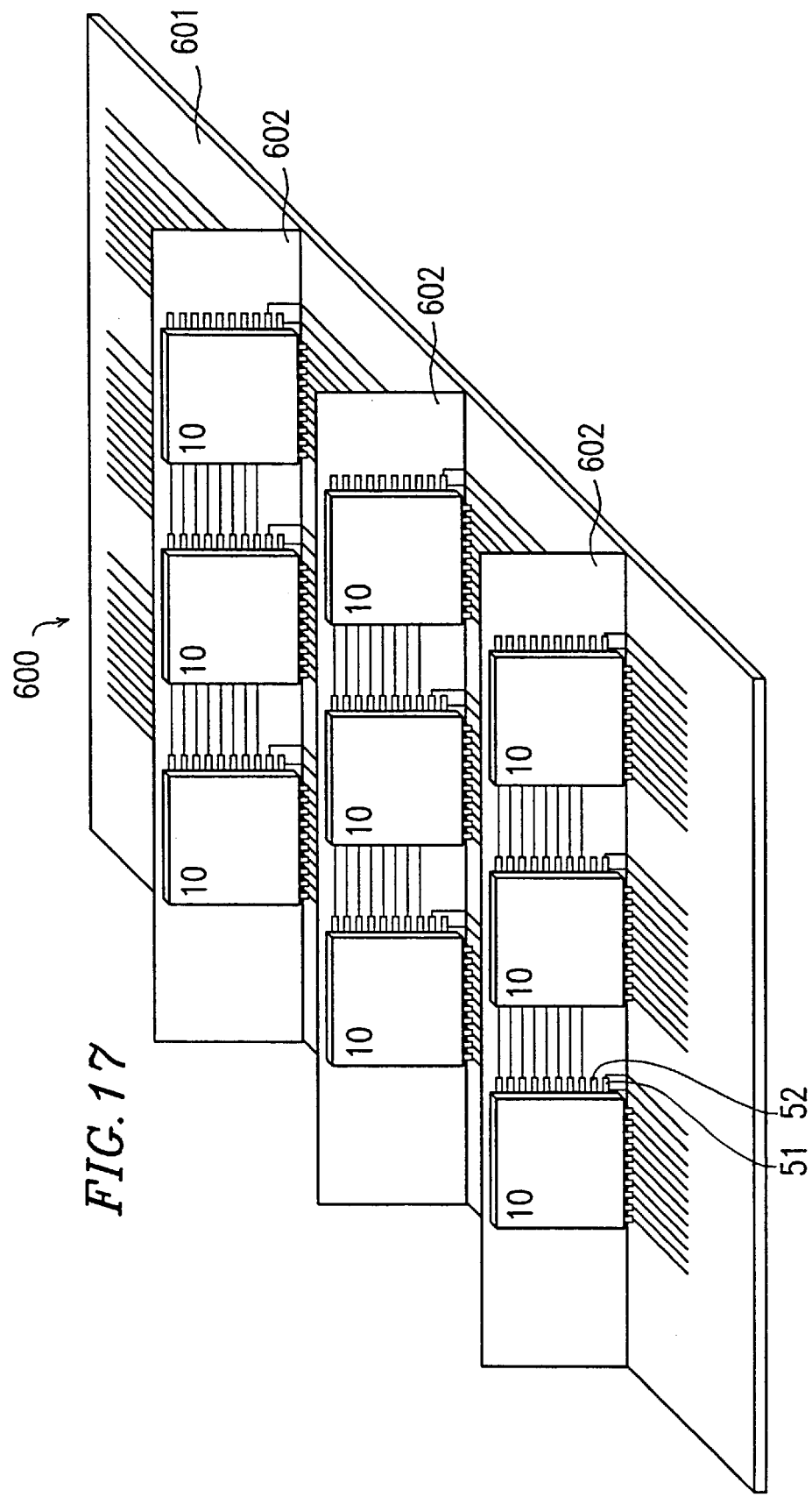
FIG. 17 is a diagram illustrating another exemplary configuration of a semiconductor mounting system in which IC chips are mounted in a three-dimensional arrangement.

FIG. 17 illustrates a semiconductor mounting system 600 which has an IC chip configuration similar to that of the semiconductor mounting system 500, but with different pin connections. As the semiconductor mounting system 500, the semiconductor mounting system 600 includes a first set of lines formed on a first printed board 601 and a second set of lines formed on a second printed board 602 which is provided perpendicularly to the first printed board 601. In the semiconductor mounting system 600, among the pins of each IC chip corresponding to the second printed board 602 (i.e., pins extending laterally), two pins 51 and 52 are connected to corresponding ones of the first (vertically-extending) lines on the first printed board 601. Such pins 51 and 52 can be used for signal lines which are operated at a relatively slow speed (e.g., a ground line, a power supply line, a control signal line used at a set-up, etc.) since these pins 51 and 52 cause a signal delay with respect to the other pins connected to the first lines (pins extending down) due to the line length difference therebetween. As well as the pins 51 and 52 illustrated in FIG. 17, any other pin corresponding to a line whose signal transfer speed is lower than that of the other lines can be used as a pin for such a low-speed operation line.

Figure 18A:
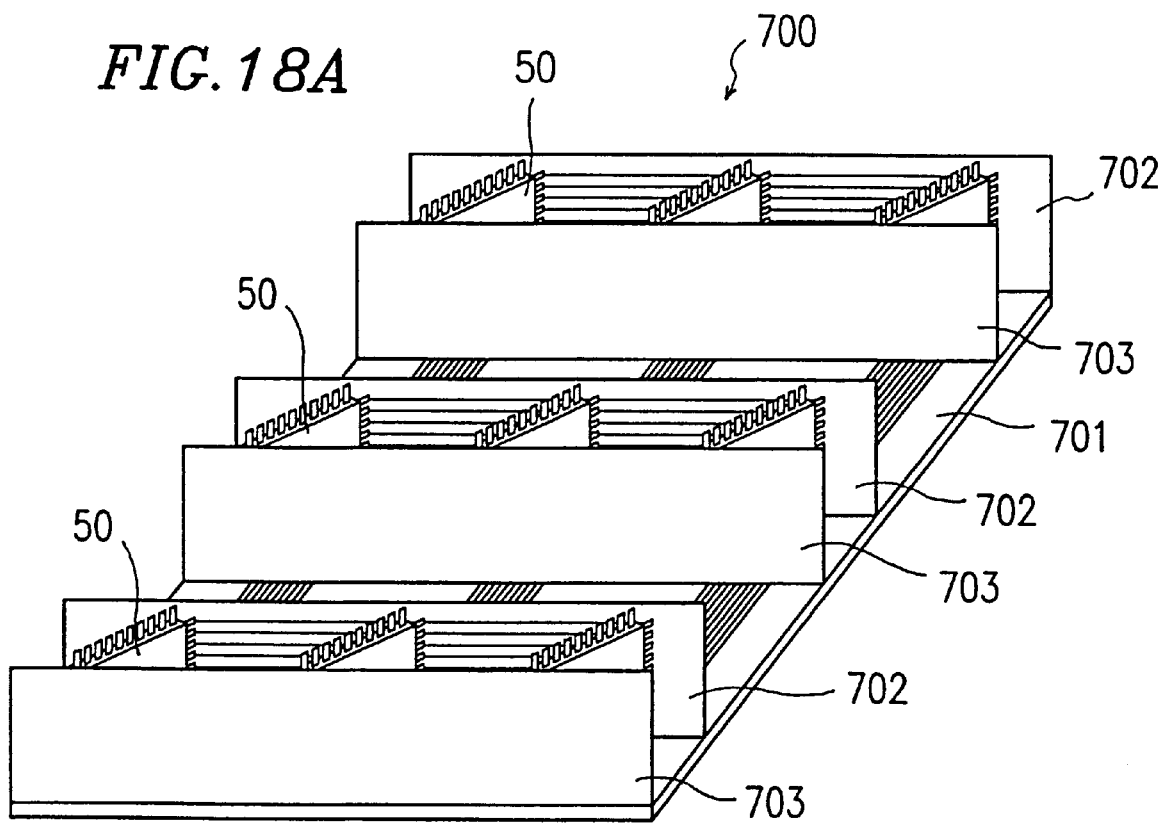
FIGS. 18A and 18B illustrate an exemplary configuration of a semiconductor mounting system in which IC chips are mounted in a three-dimensional arrangement.
Figure 18B:
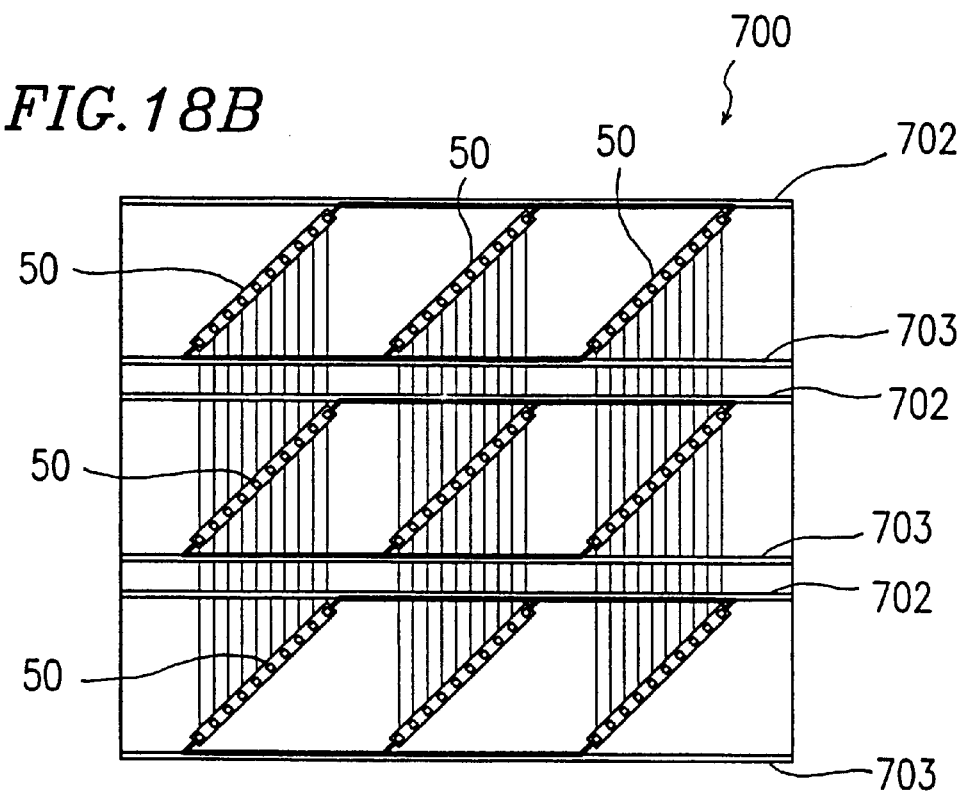

FIGS. 18A and 18B illustrate a semiconductor mounting system 700 mounting a plurality of IC chips 50 each provided with pins on all the four side surfaces thereof. As illustrated in FIG. 18A, each IC chip 50 is mounted substantially perpendicular to a first substrate 701 and diagonally to printed boards 702 and 703, which are arranged perpendicular to the first substrate 701. It is noted that the upper substrate (fourth substrate 704) is not shown in FIG. 18A. FIG. 18B is a top view of the semiconductor mounting system 700 with the upper substrate being removed. By mounting IC chips as illustrated in these figures, it is possible to increase the number of conductive lines, thereby improving the data transfer rate.

Figure 19A:
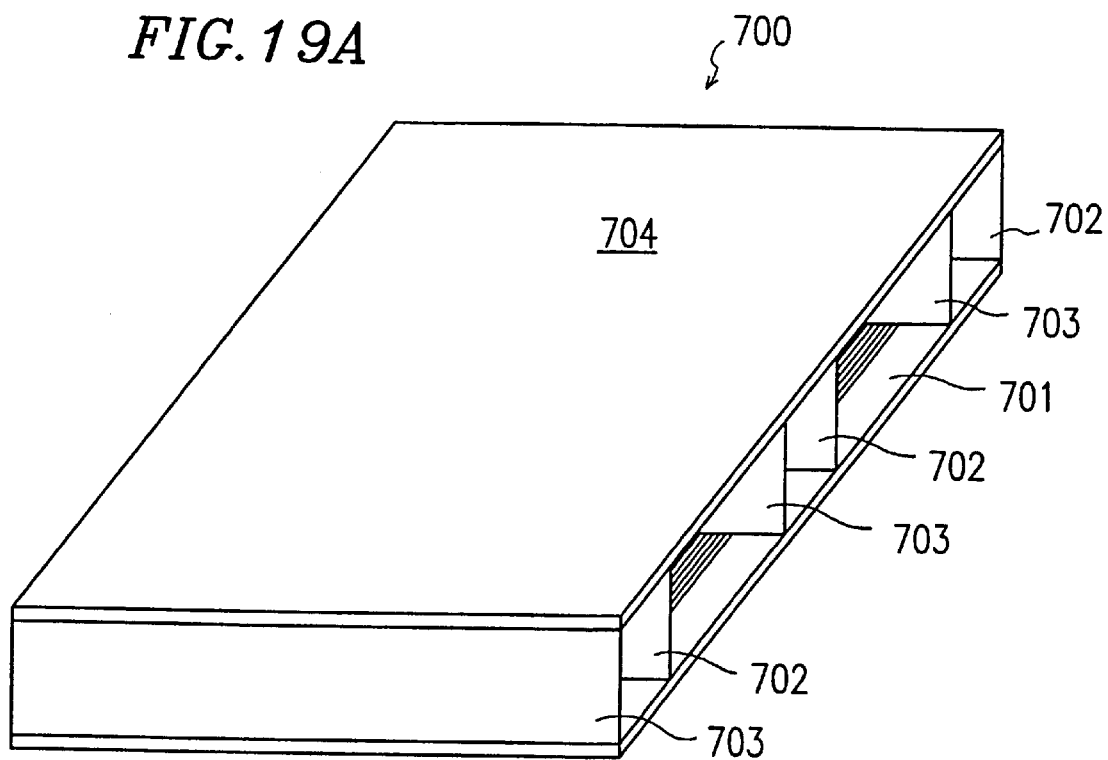
FIGS. 19A and 19B illustrate another exemplary configuration of a semiconductor mounting system in which IC chips are mounted in a three-dimensional arrangement.
Figure 19B:
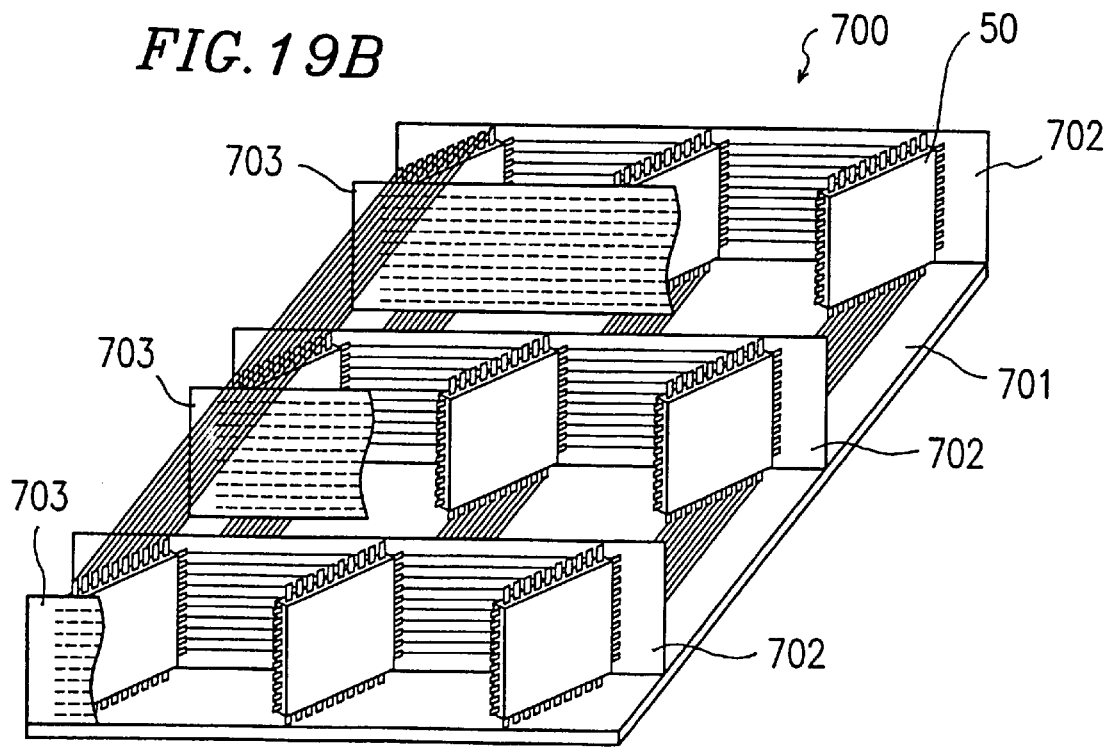

FIG. 19A is a perspective view illustrating the semiconductor mounting system 700, and FIG. 19B is another view illustrating the semiconductor mounting system 700 with some of the substrates being partially cut away to better show the internal structure thereof.

In the semiconductor mounting systems 500 to 700 according to the present example, the skew among signals due to the line length difference is reduced by equalizing the length of the various lines provided between IC chips (devices), while the data transfer rate is improved by increasing the number of signal lines (the number of pins per chip).

As described above, according to the present invention, it is possible to reduce the skew due to the line length difference while improving the data transfer rate by providing a plurality of pins on two or more side surfaces of an IC chip and by equalizing the length of the lines provided between two IC chips. Particularly, by arranging printed boards in a three-dimensional configuration so as to accommodate a plurality of pins provided on side surfaces of IC chips, it is possible to equalize the line length, thus reducing the skew, and to realize a high data transfer rate and a small mounting area.

Moreover, by selecting a clock signal transfer path in accordance with a data signal transfer path, it is possible to transfer the clock signal and the data signals in the same direction. Thus, it is possible to reduce the clock skew regardless of the path along which the data signal is transferred.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor mounting system, comprising a first semiconductor chip in which a first semiconductor integrated circuit is packaged and a second semiconductor chip in which a second semiconductor integrated circuit is packaged,
   the first semiconductor chip comprising a plurality of first pins provided on a first surface and a plurality of second pins provided on a second surface,
   the second semiconductor chip comprising a plurality of third pins provided on a third surface and a plurality of fourth pins provided on a fourth surface,
   the semiconductor mounting system further comprising:
      a plurality of first lines for electrically connecting the first pins with the third pins; and
      a plurality of second lines for electrically connecting the second pins with the fourth pins, and
   a length of the first lines being substantially equal to a length of the second lines.

2. A semiconductor mounting system according to claim 1, wherein the first surface is adjacent to the second surface, and the third surface is adjacent to the fourth surface.

3. A semiconductor mounting system according to claim 1, wherein the first surface opposes the second surface, and the third surface opposes the fourth surface.

4. A semiconductor mounting system according to claim 1, further comprising:
   a first substrate on which the first lines are provided; and
   a second substrate on which the second lines are provided, wherein
   at least one of the first substrate and the second substrate includes a groove for mounting at least one of the first semiconductor chip and the second semiconductor chip.

5. A semiconductor mounting system according to claim 1, wherein:
   the first semiconductor chip further comprises a plurality of first pads which are electrically connected to the first pins via a plurality of first wires;
   the second semiconductor chip further comprises a plurality of second pads which are electrically connected to the second pins via a plurality of second wires; and
   a length of each of the first wires is substantially equal to a length of each of the second wires.

6. A semiconductor mounting system, comprising a semiconductor chip in which a semiconductor integrated circuit is packaged,
   the semiconductor chip comprising a plurality of first pins provided on a first surface and a plurality of second pins provided on a second surface,
   the semiconductor mounting system further comprising:
      a plurality of first lines which are electrically connected to the first pins; and
      a plurality of second lines which are electrically connected to the second pins, and
   a first plane on which the first lines are provided being substantially perpendicular to a second plane on which the second lines are provided.

7. A semiconductor mounting system according to claim 6, wherein:
   a direction in which the first lines extend is substantially parallel to a direction in which the second lines extend; and the semiconductor chip is substantially perpendicular to at least one of the first plane and the second plane.

8. A semiconductor mounting system, comprising a first semiconductor chip in which a first semiconductor integrated circuit functioning as a master is packaged and a plurality of second semiconductor chips in each of which a second semiconductor integrated circuit functioning as a slave is packaged, the second semiconductor chips each comprising:
a plurality of first pins provided on a first surface;
a plurality of second pins provided on a second surface which is adjacent to the first surface; and
a synchronization circuit for synchronizing a plurality of signals respectively input to the first pins and for outputting the synchronized signals respectively to the second pins.

9. A semiconductor mounting system according to claim 8, wherein a clock signal is input to one of the first pins, and the synchronization circuit performs a synchronization operation based on the clock signal.

10. A semiconductor mounting system according to claim 8, further comprising a selection circuit for selecting one of: a first path for electrically connecting the first pins respectively with the second pins; and a second path for electrically connecting each of the first pins with the second semiconductor integrated circuit.

11. A semiconductor mounting system according to claim 10, wherein the selection circuit selects one of the first path and the second path based on a selection signal supplied from the first semiconductor chip.

12. A semiconductor mounting system according to claim 10, wherein:
each of the second semiconductor chips further comprises a plurality of terminal resistors respectively corresponding to the first pins; and
each of the terminal resistors is connected to corresponding one of the first pins based on the selection signal.

13. A semiconductor mounting system according to claim 8, wherein the first semiconductor integrated circuit is a memory controller and the second semiconductor integrated circuit is a memory.

14. A semiconductor chip in which a semiconductor integrated circuit is packaged, the chip comprising:
a plurality of first pins provided on a first surface;
a plurality of second pins provided on a second surface which is adjacent to the first surface; and
a synchronization circuit for synchronizing a plurality of signals respectively input to the first pins and for outputting the synchronized signals respectively to the second pins.

\* \* \* \* \*